(12) United States Patent
Kawahata et al.

(10) Patent No.: US 6,963,327 B2
(45) Date of Patent: Nov. 8, 2005

(54) SHIFT REGISTER CIRCUIT INCLUDING FIRST SHIFT REGISTER HAVING PLURALITY OF STAGES CONNECTED IN CASCADE AND SECOND SHIFT REGISTER HAVING MORE STAGES

(75) Inventors: Ken Kawahata, Miyagi-ken (JP); Yukimitsu Yamada, Miyagi-ken (JP)

(73) Assignee: ALPS Electronics Co., Ltd., Tokyo (JP)

( * ) Notice: Subject to any disclaimer, the term of this patent is extended or adjusted under 35 U.S.C. 154(b) by 698 days.

(21) Appl. No.: 10/015,169

(22) Filed: Oct. 23, 2001

(65) Prior Publication Data

US 2003/0206608 A1 Nov. 6, 2003

(30) Foreign Application Priority Data

Oct. 24, 2000 (JP) .................................... 2000-324496
Jul. 9, 2001 (JP) .................................... 2001-208160

(51) Int. Cl.$^7$ .............................................. G09G 3/36
(52) U.S. Cl. ......................... 345/100; 326/93; 377/64
(58) Field of Search .......................... 345/98, 100, 99; 348/302; 326/93, 95–98; 377/64, 75, 76, 78

(56) References Cited

U.S. PATENT DOCUMENTS

| 5,369,417 | A | * | 11/1994 | Tanaka | 345/98 |
| 5,682,175 | A | * | 10/1997 | Kitamura | 345/98 |
| 5,909,247 | A | * | 6/1999 | Hosokai et al. | 348/302 |
| 5,949,397 | A | | 9/1999 | Koyama et al. | |
| 6,175,352 | B1 | * | 1/2001 | Kay et al. | 345/100 |
| 6,670,943 | B1 | * | 12/2003 | Ishii et al. | 345/100 |
| 6,670,944 | B1 | * | 12/2003 | Ishii | 345/100 |

* cited by examiner

*Primary Examiner*—Kent Chang
(74) *Attorney, Agent, or Firm*—Brinks Hofer Gilson & Lione

(57) ABSTRACT

A shift register circuit includes a first shift register having a plurality of stages connected in cascade, and a second shift register having more stages than the first shift register. The stages of the second shift register are divided into groups each formed of consecutive stages. The stages of the first shift register output pulse sequences having a predetermined number of consecutive pulses and having different phases from each other, to the stages constituting the groups of the second shift register as clock signals.

41 Claims, 20 Drawing Sheets

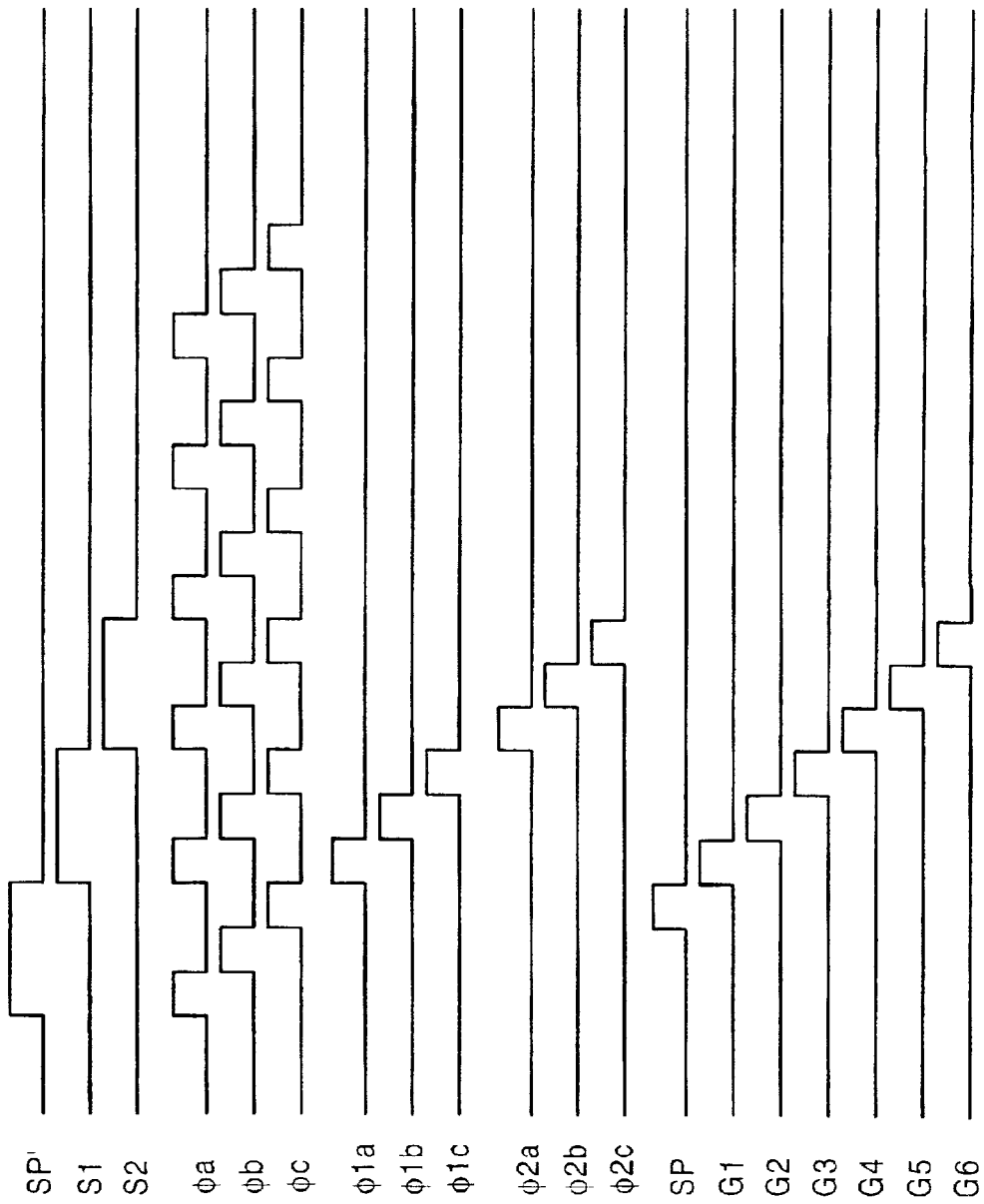

and Gem are always operating, voltages are always applied to transistors in these gate circuits, leading to the reduced reliability of the transistors due to the stress of the voltages.

SHIFT REGISTER CIRCUIT INCLUDING FIRST SHIFT REGISTER HAVING PLURALITY OF STAGES CONNECTED IN CASCADE AND SECOND SHIFT REGISTER HAVING MORE STAGES

BACKGROUND OF THE INVENTION

1. Field of the Invention

The present invention relates to shift register circuits used in display apparatuses and image sensors, and more particularly, to a shift register circuit which sends a clock signal to a shift register.

2. Description of the Related Art

FIG. 19 is a circuit diagram of a conventional shift register circuit. The shift register circuit includes a first shift register in which a plurality of stages F'1, F'2, F'3, ..., and F'm are connected in cascade, and a second shift register in which a plurality of stages F1, F2, F3, ..., and Fn are connected in cascade and three consecutive stages form one group. In the second shift register, for example, stages F1, F2, and F3 form one group Gr1.

Three-phase clock signals $\phi a$, $\phi b$, and $\phi c$ are input to the second shift register through gate circuits Ge1, Ge2, Ge3, ..., and Gem. These clock signals $\phi a$, $\phi b$, and $\phi c$ are selectively sent to the groups of the second shift register when the outputs S1, S2, S3, ..., and Sm of the first shift register are input to the gate circuits Ge1, Ge2, Ge3, ..., and Gem. Such selective clock-signal inputs are used for reducing the power consumption of the shift register circuit. The outputs G1, G2, G3, ..., and Gn of the second shift register drive a display apparatus or the like.

FIG. 20 is a timing chart showing the operation of the shift register circuit. When a start pulse SP' is input to a first stage F'1 of the first shift register, the pulse is sequentially passed to the following stages. The signal S1 is first output, then the signal S2, and the signals S3, S4, ..., and Sm are sequentially output. These signals S1, S2, S3, ..., and Sm are input to the gate circuits Ge1, Ge2, Ge3, ..., and Gem, respectively, and these gate circuits Ge1, Ge2, GE3, ..., and Gem select necessary pulses among the pulse sequences of the three-phase clock signals $\phi a$, 100 b, and $\phi c$ according to the signals S1, S2, S3, ..., and Sm. For example, the gate circuit Ge1 selects clock signals $\phi 1a$, $\phi 2b$, and $\phi 1c$, and the gate circuit Ge2 selects clock signals $\phi 2a$, $\phi 2b$, and $\phi 2c$.

Clock signals selected by the gate circuits Ge1, Ge2, Ge3, ..., and Gem are sent to the groups of the second shift register. The clock signals $\phi 1a$, $\phi 1b$, and $\phi c$ selected by the gate circuit Ge1, for example, are sent to the group Gr1, and input to the stages F1, F2, and F3 of the group Gr1. At the same time, the start pulse SP is input to the first stage F1 of the second shift register. The stages F1, F2, and F3 of the second shift register sequentially output signals G1, G2, and G3, and stages F4 and subsequent stages sequentially output signals G4, G5, G6, ..., and Gn in the same way.

The above-described conventional technology has the following problem. In the conventional technology, the outputs S1, S2, S2, ..., and Sm of the first shift register are sent to the gate circuits Ge1, Ge2, Ge3, ..., and Gem, and the gate circuits Ge1, Ge2, Ge3, ..., and Gem select the clock signals $\phi a$, $\phi b$, and $\phi c$ for the groups of the second shift register. Therefore, the gate circuits Ge1, Ge2, Ge3, ..., and Gem need to be disposed between the first shift register and the second shift register, and thereby, the shift register circuit has a large circuit scale.

To form the gate circuits Ge1, Ge2, Ge3, ..., and Gem and the second register on the same substrate (glass substrate) as a display apparatus, transistors in these gate circuits and the second shift register need to be made from a material such as amorphous silicon or polycrystalline silicon. When voltages are continually applied to transistors made from these materials, the characteristics of the transistors deteriorate due to voltage stress and their reliability is reduced in some cases. Therefore, it is important that voltage is applied to such transistors as little as possible. In the above conventional technology, since the gate circuits Ge1, Ge2, Ge3, ..., and Gem are always operating, voltages are always applied to transistors in these gate circuits, leading to the reduced reliability of the transistors due to the stress of the voltages.

SUMMARY OF THE INVENTION

The present invention has been made to solve the foregoing problems. Accordingly, it is an object of the present invention to provide a shift register circuit, a display apparatus, and an image sensor which selectively send a clock signal to a second shift register to reduce power consumption, which has a small circuit scale, and which does not reduce the reliability of transistors.

The foregoing object is achieved in one aspect of the present invention through the provision of a shift register circuit including a first shift register having a plurality of stages connected in cascade and a second shift register having more stages than the first shift register. The stages of the second shift register are divided into groups each formed of consecutive stages. The stages of the first shift register are configured to transmit output pulse sequences having a predetermined number of consecutive pulses and having different phases from each other, to the stages constituting the groups of the second shift register as clock signals.

It is preferred that the first shift register has an input terminal that is configured to receive a pulse sequence having a finite number of consecutive pulses.

It is also preferred that the first shift register be a bi-directional shift register.

According to the above structure, since the clock signals are sent only to the stages which require the signals in the second shift register, low power consumption is implemented. In addition, since the outputs of the stages of the first shift register are directly input to the second shift register, there is no need to dispose gate circuits between the first shift register and the second shift register. Therefore, the circuit scale of the shift register circuit is made small.

Furthermore, according to the above structure, the clock input terminals of the stages in each group of the second shift register are collectively handled, and therefore, each group has a set of clock input terminals. Consequently, the wiring of the clock signals for the second shift register is not drawn through the whole area of the second shift register. The wiring of the clock signals in the second shift register is made short, and therefore, a delay of the clock signals caused by a wiring capacitance and a wiring resistance is made small.

It is preferred that a plurality of the second shift registers is provided.

According to the above structure, since the outputs of the stages of the plurality of the second shift registers can drive odd fields and even fields in a display apparatus, the shift register circuit can be used for interlaced driving. In addition, it is not necessary to provide gate circuits to switch between odd fields and even fields, the circuit scale is made small.

It is preferred that the outputs of the stages of the second shift register serve as scanning signals for an active matrix circuit have switching devices associated with the intersections of signal lines and scanning lines.

When the outputs of the stages of the second shift register serve as scanning signals for an active matrix circuit, that is, when the shift register circuit is used for a gate driver or a source driver of the active matrix circuit, the circuit scale of the gate driver or the source driver is made small.

It is preferred that MIS transistors in the active matrix circuit and the second shift register are all of the same type.

According to the above structure, since the MIS transistors included in the active matrix circuit and the second shift register are the same type, a manufacturing process is simple.

It is preferred that MIS transistors included in the active matrix circuit and the second shift register are all made from a material which includes amorphous silicon or polycrystalline silicon.

When a voltage is always applied to an MIS transistor made from a material which includes amorphous silicon or polycrystalline silicon, the reliability of the MIS transistor may deteriorate. According to the above structure, since a voltage is not applied to the MIS transistors included in the second shift register for most periods, the reliability of the MIS transistors do not deteriorate.

It is preferred that the second shift register be formed on the same substrate as the active matrix circuit.

When the second shift register and the active matrix circuit are formed on the same substrate, wiring required between them is made short. When they are formed on the same substrate, MIS transistors included in them are formed by the same manufacturing process. Therefore, the MIS transistors included in the second shift register and the active matrix circuit are the same type and are made from the same material.

An active matrix circuit (specifically, a display apparatus) is generally large in size. Therefore, if the second shift register and an active matrix circuit are formed on the same substrate, the wiring of the clock signals for the second shift register needs to be drawn long correspondingly to the size of the active matrix circuit. According to the above-described structure, since the wiring of the clock signals in the second shift register is made short, a delay of the clock signals caused by a wiring capacitance and a wiring resistance is reduced. In addition, since the wiring of the clock signals in the second shift register is made short, the line width of the wiring can be reduced. As a result, when the active matrix circuit is used as a display apparatus, an ineffective area (frame portion) where data cannot be displayed is reduced.

It is preferred that each stage of the second shift register have as terminals only clock input terminals configured to receive n-phase (n is an integer equal to two or more) clock signals; an input terminal configured to receive a signal sent from an input terminal of the second shift register or from an output terminal of a previous stage; and an output terminal configured to transmit a signal to an input terminal of a subsequent stage or to an output terminal of the second shift register, and an initial-stage level configured to initialize the state of each stage of the second shift register input to the stage at one of the clock input terminals.

According to the above structure, since an initial-stage level used for initializing the state of each stage of the second shift register is input to the stage at one of the clock input terminals, wiring (such as a ground line) used only for sending the initial-stage level is not required. Therefore, the number of lines connected to the second shift register is reduced, and an area required for wiring is reduced.

When a voltage is always applied in one direction to an MIS transistor made from a material which includes amorphous silicon or polycrystalline silicon, the reliability of the MIS transistor may deteriorate. When an initial-stage level is input to an MIS transistor through one of the clock input terminals, of which the potential is always changed, not through a line always fixed to the initial-state level, the direction in which a voltage is applied to the MIS transistor is always changed, and it is not fixed to one direction. Therefore, the reliability of the MIS transistor is increased.

In addition, each group of the second shift register may be configured to receive output pulses from a set of the stages of the first shift register, the output pulses from the set of stages supplied to each group being isolated from every other group.

The stages in each group of the second shift register may be divided into an even group configured to receive an even field of output pulses supplied to stages in the even group and an odd group configured to receive an odd field of output pulses supplied to stages in the odd group, the even and odd fields of each group having different timings of the output pulses.

Each group may have at least at many stages as clock signals, each stage in each group having input terminals configured to receive the same number of clock signals, at least one stage in a particular group having the clock signals supplied in a different order from at least one other stages in the particular group.

The stages may have input terminals configured to receive an output from an immediately previous stage and an output from an immediately subsequent stage (excluding an initial and final stage).

In a second aspect of the invention, the shift register circuit may comprise at least one second shift register with a plurality of stages connected in cascade, the at least one second shift register divided into groups of consecutive stages, and clock lines connected with the stages in each group, the clock lines configured to supply clock signals to the stages, the clock lines of each group isolated from the clock lines in each other group and having a predetermined number of consecutive pulses with different phases from each other.

Each stage may comprise terminals including: clock input terminals configured to receive the clock signals, a first input terminal configured to receive an output signal from one of an output terminal of a previous stage and an external start pulse, and an output terminal configured to receive an output signal.

The terminals may further comprise a second input terminal configured to receive an output signal from an output terminal of a subsequent stage.

The second input terminal may be configured to receive an output signal from an immediately previous stage and an output signal from an immediately subsequent stage.

The shift register circuit may further comprise a first shift register having fewer stages than the second shift register, the stages of the first shift register configured to supply the clock signals to the clock lines.

The stages in each group of the second shift register may be divided into an even group configured to receive an even field of output pulses supplied to stages in the even group and an odd group configured to receive an odd field of output pulses supplied to stages in the odd group, the even and odd fields of each group having different timings of the output pulses, the even and odd groups each having a single start pulse with different timings.

Each group may have at least at many stages as clock signals, each stage in each group having input terminals configured to receive the same number of clock signals, at least one stage in a particular group configured to receive the clock signals supplied differently from at least one other stage in the particular group.

In another aspect of the invention, a method of increasing reliability of a shift register circuit having a first and second shift register comprises dividing stages in the second shift register into groups of consecutive stages, supplying clock lines of the second shift register with clock signals of different phases from the first shift register, and isolating the clock lines between groups.

The method may further comprise reducing a wiring resistance and capacitance of the clock lines by reducing a length and a line width of the clock lines.

The method may further comprise reducing at least one of a number and duration of pulses applied to the first shift register and second shift register.

The method may further comprise forming the clock lines on a thin film transistor substrate and forming TCP wiring connecting the clock lines with the first shift register.

The method may further comprise receiving an output signal from a previous stage in a particular stage and supplying an output signal to a subsequent stage from the particular stage.

The method may further comprise feeding back an output signal from the subsequent stage in the particular stage.

The method may further comprise supplying pulses through stages in the first shift register, decreasing a number of the pulses used effectively and supplied to the clock lines.

The method may further comprise dividing the groups into even group having an even field of output pulses supplied to stages in the even group and an odd group having an odd field of output pulses supplied to stages in the odd group, initiating the even and odd groups with a single start pulse, and differing timings of the output pulses between the even and odd fields of each group.

The method may further comprise supplying the same clock signals to all stages in a particular group and supplying the clock signals to at least one of the stages in the particular group differently from at least one other stage in the particular group.

The method may further comprise fixing the clock signals from all stages of the first shift register to a low level after clock pulses pass through each stage of the first shift register.

The foregoing object is achieved in another aspect of the present invention through the provision of a display apparatus or an image sensor which includes a shift register circuit described above.

BRIEF DESCRIPTION OF THE DRAWINGS

FIG. 20 is a timing chart of operations in the conventional shift register circuit.

DESCRIPTION OF THE PREFERRED EMBODIMENTS

Figure 1:
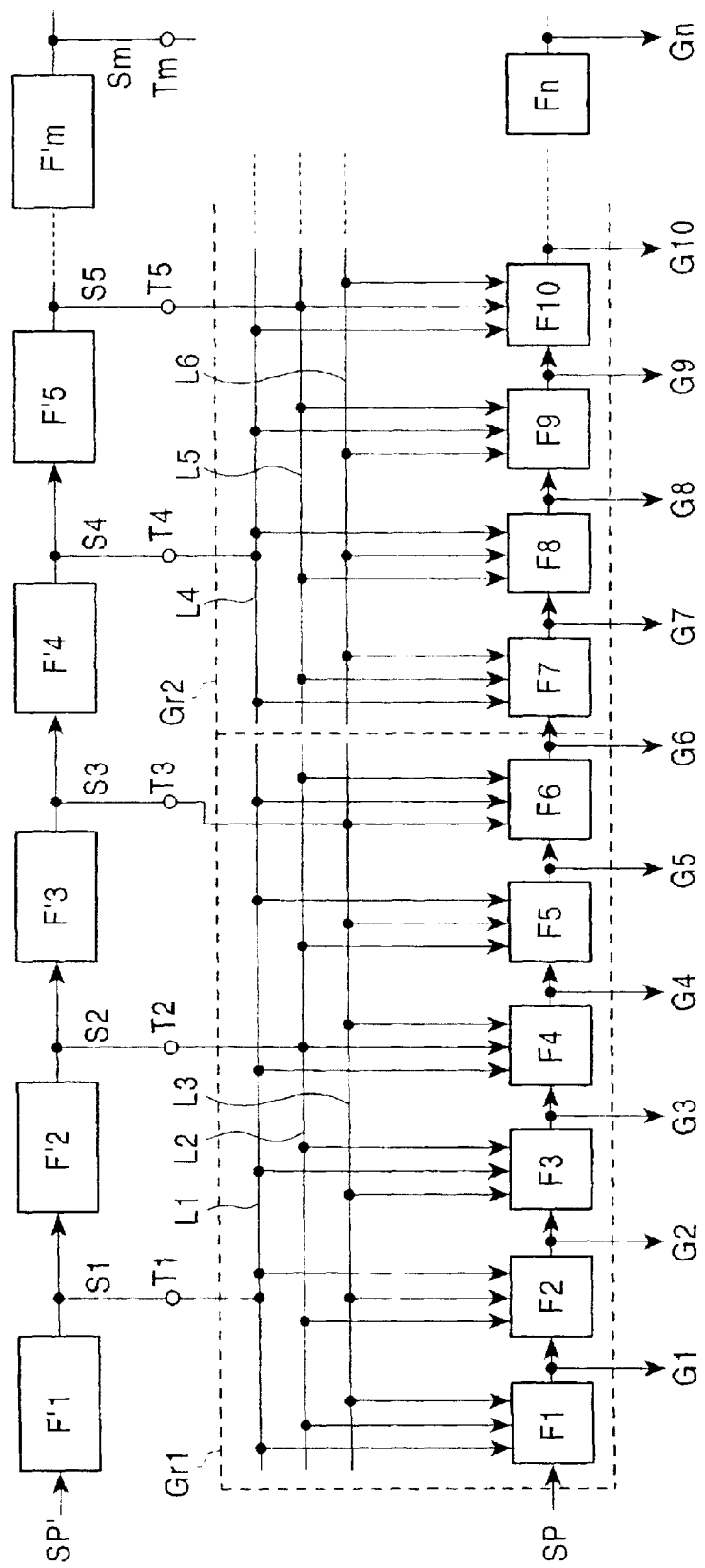
FIG. 1 is a structural view of a shift register circuit according to a first embodiment of the present invention.

FIG. 1 is a structural view of a shift register circuit according to a first embodiment of the present invention. The shift register circuit includes a first shift register in which a plurality of stages F'1, F'2, F'3, . . . , and F'm are connected in cascade, and a second shift register in which a plurality of stages F1, F2, F3, . . . , and Fn are connected in cascade and six consecutive stages form one group. In the second shift register, stages F1 to F6, for example, form a group Gr1, and stages F7 to F12 form a group Gr2.

Three-phase clock signals are sent from the output terminals of three consecutive stages in the first shift register to the groups of the second shift register. For example, three consecutive stages F'1, F'2, and F'3 of the first shift register send clock signals S1, S2, and S3 to the group Gr1 of the second shift register, and three consecutive stages F'4, F'5, and F'6 of the first shift register send clock signals S4, S5, and S6 to the group Gr2 of the second shift register.

In each group, three clock input terminals for the same-phase signals are connected to each other in stages, and the terminals are connected to a set of (three) clock input terminals provided for the group. For example, three clock input terminals of the stages in the group Gr1 are connected to clock signal lines L1, L2, and L3, and these clock signal lines L1, L2, and L3 are connected to a set of clock input terminals T1, T2, and T3 provided for the group Gr1. The clock signal lines L1, L2, and L3 are not connected to clock signal lines (such as clock signal lines L4, L5, and L6 for the group Gr2) for other groups. Therefore, clock signal lines for one group are not drawn through the whole area of the second shift register. In each stage of each group, the same number of clock signal lines L1, L2, and L3, and thus clock signals, are connected with the inputs of the stages, albeit in a different order in at least one stage in a particular group from another of the stages in that group.

Since clock signal lines (such as the clock signal lines L1, L2, and L3 in the group Gr1) in a group are wiring formed on a TFT substrate (glass substrate), its resistance is high. In contrast, wiring drawn from the first shift register to the one set of clock input terminals (such as the one set of clock input terminals T1, T2, and T3 provided for the group Gr1) provided for each group of the second shift register is TCP wiring, and therefore, a low-resistance wiring material can be used. Consequently, a delay of clock signals caused by a wiring resistance can be made small.

Figure 2:
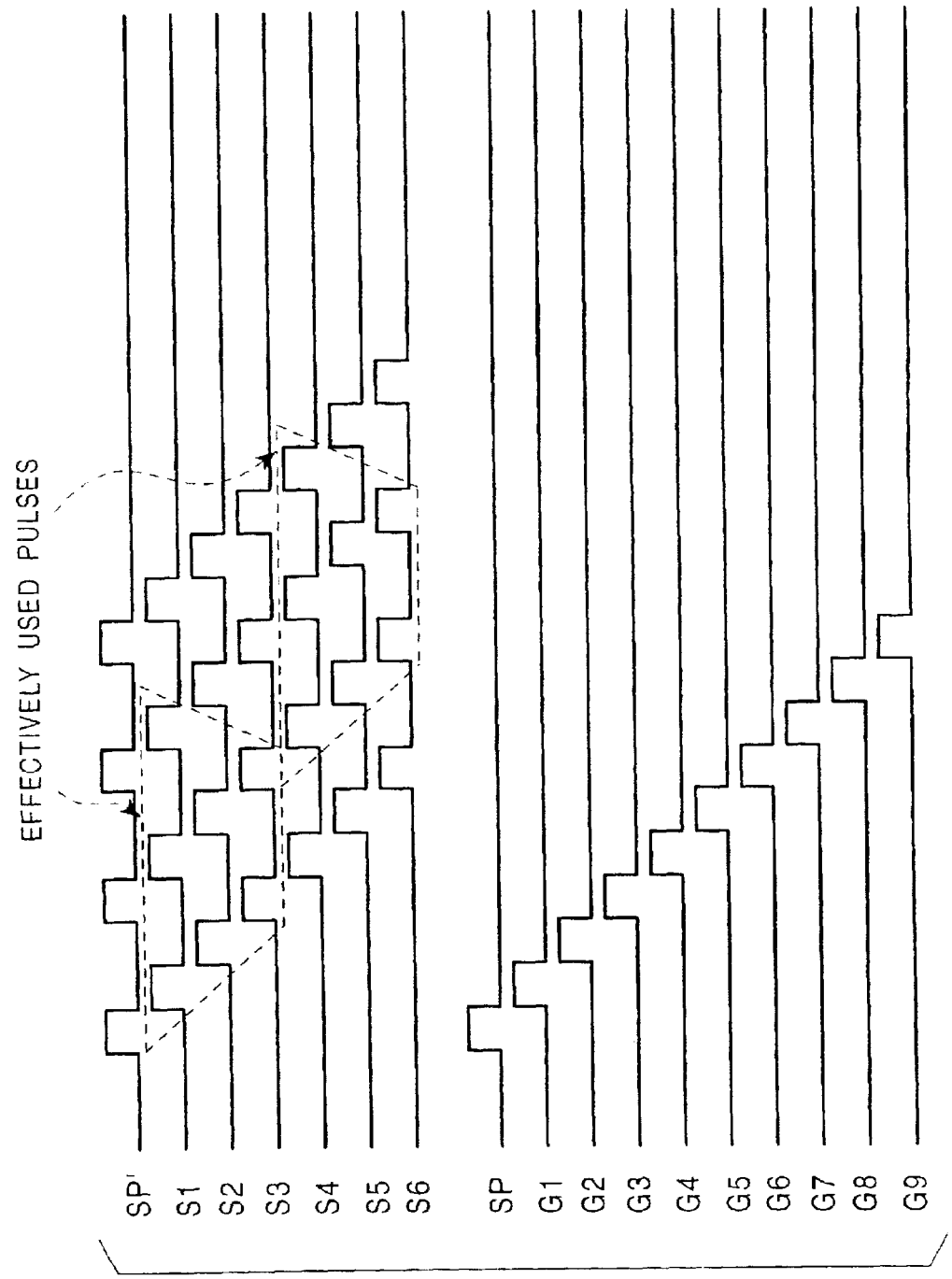
FIG. 2 is a timing chart of operations in the shift register circuit according to the first embodiment of the present invention.

FIG. 2 is a timing chart of operations in the shift register circuit. A start pulse signal SP, having four consecutive pulses only is input to the first stage F'1 of the first shift register. This pulse signal is sequentially sent to the following stages, and the stages F'1, F'2, F'3, . . . , and F'm of the first shift register output clock signals S1, S2, S3, . . . , and Sm each having four consecutive pulses only at different phases. The clock signals S1, S2, S3, . . . , and Sm are sent to the groups of the second shift register. For example, the clock signals S1, S2, and S3 are sent to the group Gr1 of the second shift register, and the clock signals S4, S5, and S6 are sent to the group Gr2 of the second shift register.

The clock signals S1, S2, and S3, sent to the group Gr1 of the second shift register, drive the stages F1 to F6 in the group Gr1, and sequentially send a start pulse signal SP having only one pulse input to the first stage of the following stages. The clock signals S4, S5, and S6, sent to the group Gr2 of the second shift register, drive stages F7 to F12 in the group Gr2, and sequentially send a signal G6 output from the last stage F6 of the group Gr1 to the first stage F7 of the group Gr2, to the following stages. These operations are repeated until the signal (pulse) reaches the last stage Fn of the second shift register.

After the signal having the four consecutive pulses passes through each stage of the first shift register, the clock signal output from each stage is fixed to a low level. For example, after the signal having the four consecutive pulses passes through the stages F'1 to F'3 in the first shift register, the clock signals output from the stages F'1 to F'3 are all fixed to the low level. Even in the stages F1 to F6 of the group Gr1 in the second shift register, to which the clock signals S1 to S3 are input, since the pulse has already passed the stages, signals G1 to G6 output from the stages F1 to F6 are all fixed to the low level. In other words, since not-required stages through which a pulse has been passed are set to a halt state, power consumption of the shift register circuit is decreased.

For example, among the pulses included in the clock signals S1, S2, and S3, pulses required for the operations of the group Gr1 in the second shift register are only those enclosed by a dotted line in the timing chart, and among the pulses included in the clock signals S4, S5, and S6, pulses required for the operations of the group Gr2 in the second shift register are only those enclosed by a dotted line in the timing chart. Pulses other than those described above do not affect adversely the operations of the second shift register.

Figure 3:
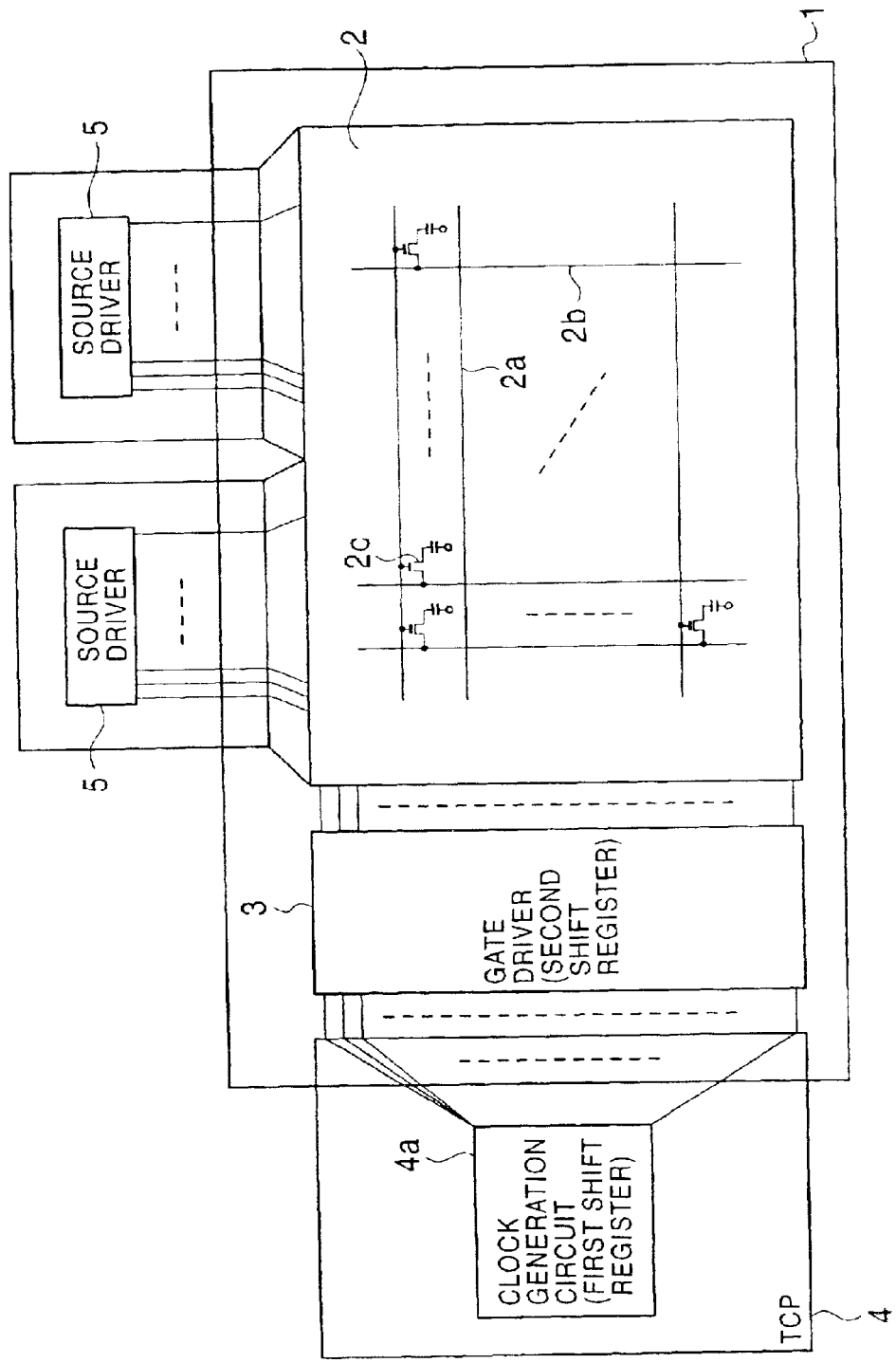
FIG. 3 is a structural view of a display apparatus in which the shift register circuit according to the first embodiment is used for a clock generation circuit and a gate driver.

FIG. 3 is a structural view showing a case in which the shift register circuit according to the above embodiment is used for a clock generation circuit and a gate driver in a display apparatus. In this display apparatus, a display area 2 is formed on a TFT substrate (glass substrate) 1, and a gate driver (second shift register) 3 for driving scanning lines 2a disposed in the display area 2 is formed at a side of the display area 2. In other words, the display area 2 and the gate driver (second shift register) 3 are formed on the same TFT substrate (glass substrate) by the same manufacturing process. Therefore, MIS transistors 2c formed at the intersections of scanning lines 2a and signal lines 2b and MIS transistors formed in the gate driver (second shift register) 3 are the same type (for example, n-channel transistors). The same material is used for both MIS transistors. Since they are formed on a glass substrate, they are fabricated from various materials, including amorphous silicon or polycrystalline silicon.

A clock generation circuit (first shift register) 4a formed on a TCP 4 sends clock signals S1, S2, S3, . . . , and Sm to the gate driver (second shift register) 3 formed on the TFT substrate (glass substrate) 1. Source drivers 5 drive the signal lines 2b disposed in the display area 2. The second shift register according to the above embodiment can be used for the source drivers in the display apparatus.

Assuming that the display apparatus is a six-inch VGA panel, for example, the gate driver (second shift register) 3, which drives the scanning lines 2a, has 480 stages. In the above embodiment, since the second shift register is divided into groups each having six stages, 480 stages are divided into 80 groups each having six stages. Therefore, the lengths of clock signal lines in each group are 1/80 of those obtained when the second shift register is not divided into groups, and the wiring capacitance and the wiring resistance of the clock signal lines in each group are 1/80 of those obtained when the second shift register is not divided into groups. The delays of the clock signals are determined by the wiring capacitance multiplied by the wiring resistance in a simple calculation, which is 1/6,400 of those obtained when the second shift register is not divided.

Figure 4:
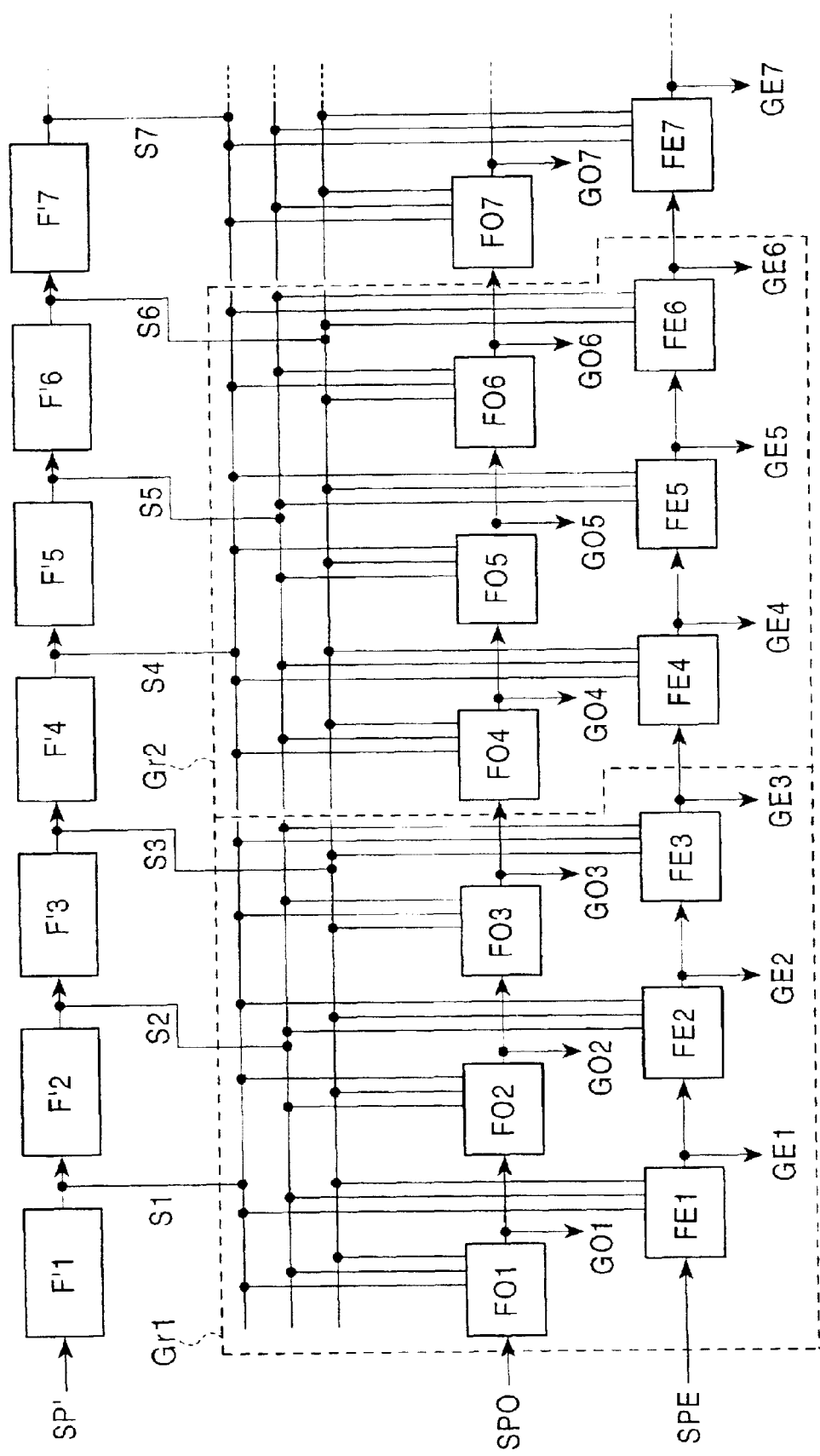
FIG. 4 is a structural view of a shift register circuit according to a second embodiment of the present invention.

FIG. 4 is a structural view of a shift register circuit according to a second embodiment of the present invention. The structure of the second embodiment will be described below by referring to FIG. 4. The same symbols as those used in the first embodiment are assigned to the same components as those used in the first embodiment, and descriptions thereof are omitted. The shift register circuit according to the present embodiment is used for a display apparatus of the interlace method, which has odd fields and even fields. Therefore, two sets of the second shift registers in the first embodiment are provided. These two sets are hereinafter called a second shift register and a third shift register. The second shift register has the same structure as the third shift register. The second shift register is for odd fields and has stages FO1, FO2, FO3, . . . The third shift register is for even fields and has stages FE1, FE2, FE3, . . .

A total of six stages formed of three consecutive stages in the second shift register and the third shift register form one group. For example, a total of six stages formed of stages FO1, FO2, and FO3 in the second shift register and stages FE1, FE2, and FE3 in the third shift register form a group Gr1; and a total of six stages formed of stages FO4, FO5, and FO6 in the second shift register and stages FE4, FE5, and FE6 in the third shift register form a group Gr2.

Figure 5:
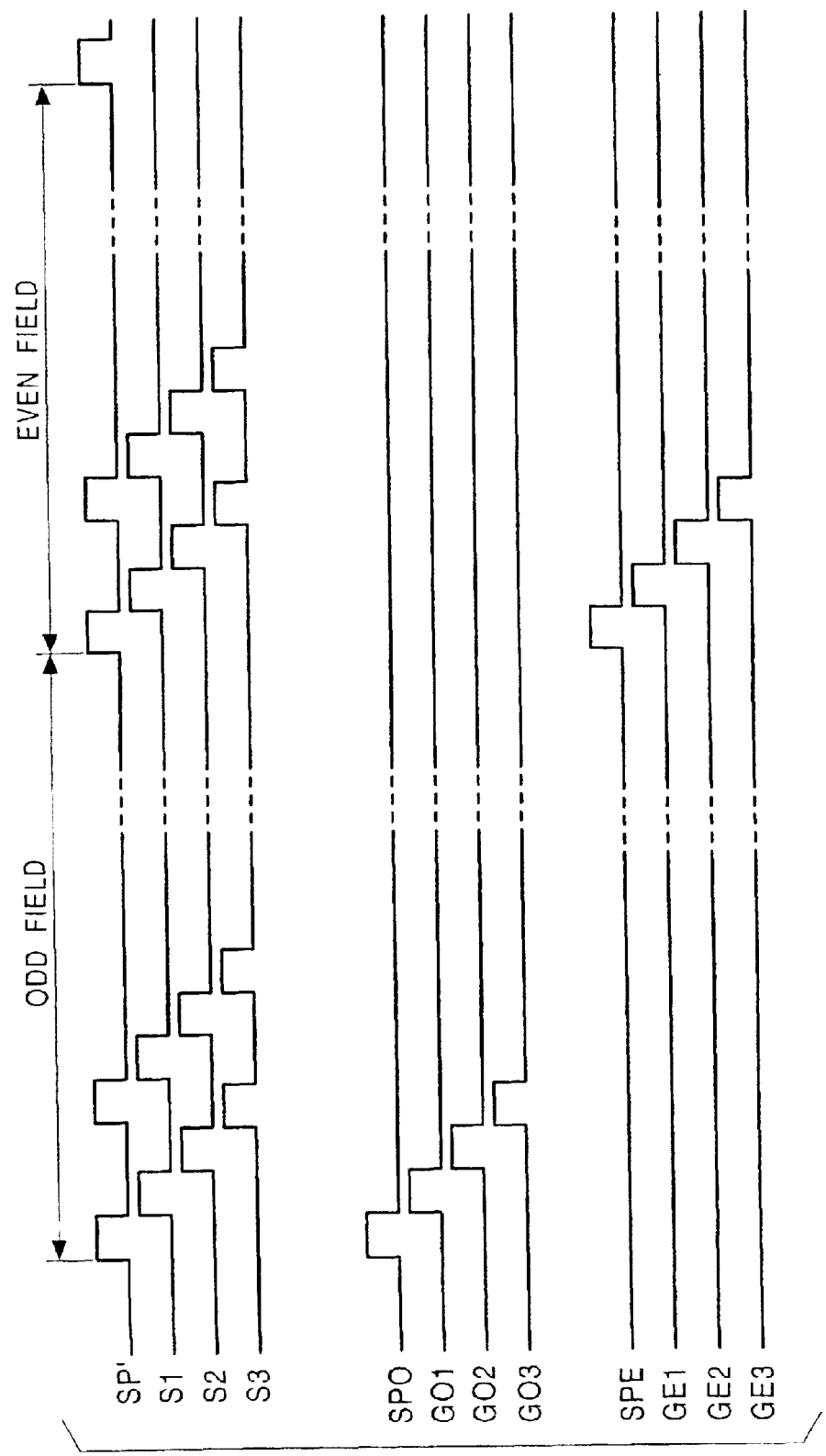
FIG. 5 is a timing chart of operations in the shift register circuit according to the second embodiment of the present invention.

FIG. 5 is a timing chart of operations in the above shift register circuit. A start pulse signal SP' having two consecutive pulses only is input to a first stage F'1 in the first shift register. These pulses are sequentially sent to the following stages. The stages F'1, F'2, F'3, . . . of the first shift register output clock signals S1, S2, S3, . . . each having two consecutive pulses at different phases. The clock signals S1, S2, S3, . . . are sent to groups in the second shift register and the third shift register. For example, the clock signals S1, S2, and S3 are sent to the group Gr1 in the second shift register and the third shift register, and clock signals S4, S5, and S6 are sent to the group Gr2.

The clock signals S1, S2, and S3, sent to the group Gr1, drive the stages FO1 to FO3 and the stages FE1 to FE3 in the group Gr1. A start pulse signal SPO having one pulse only is input to the first stage FO1 in the second shift register, and a start pulse signal SPE having only one pulse at different timing from that for the start pulse signal SPO is input to the first stage FE1 of the third shift register. The second shift register outputs signals GO1, GO2, GO3, for odd fields, and the third shift register outputs signals GE1, GE2, GE3, . . . for even fields at different timing from that for the signals for odd fields. Subsequent stages perform the same operation.

Also in the present embodiment, after the signal having the two consecutive pulses passes through each stage of the first shift register, all the clock signals output from the stages are fixed to the low level. Even for the second shift register and the third shift register, to which the clock signals are input, all the signals output from the stages are fixed to the low level after the pulse passes through them. In other words, since not-required stages through which the pulse has been passed are set to a halt state, power consumption of the shift register circuit is decreased.

Figure 6:
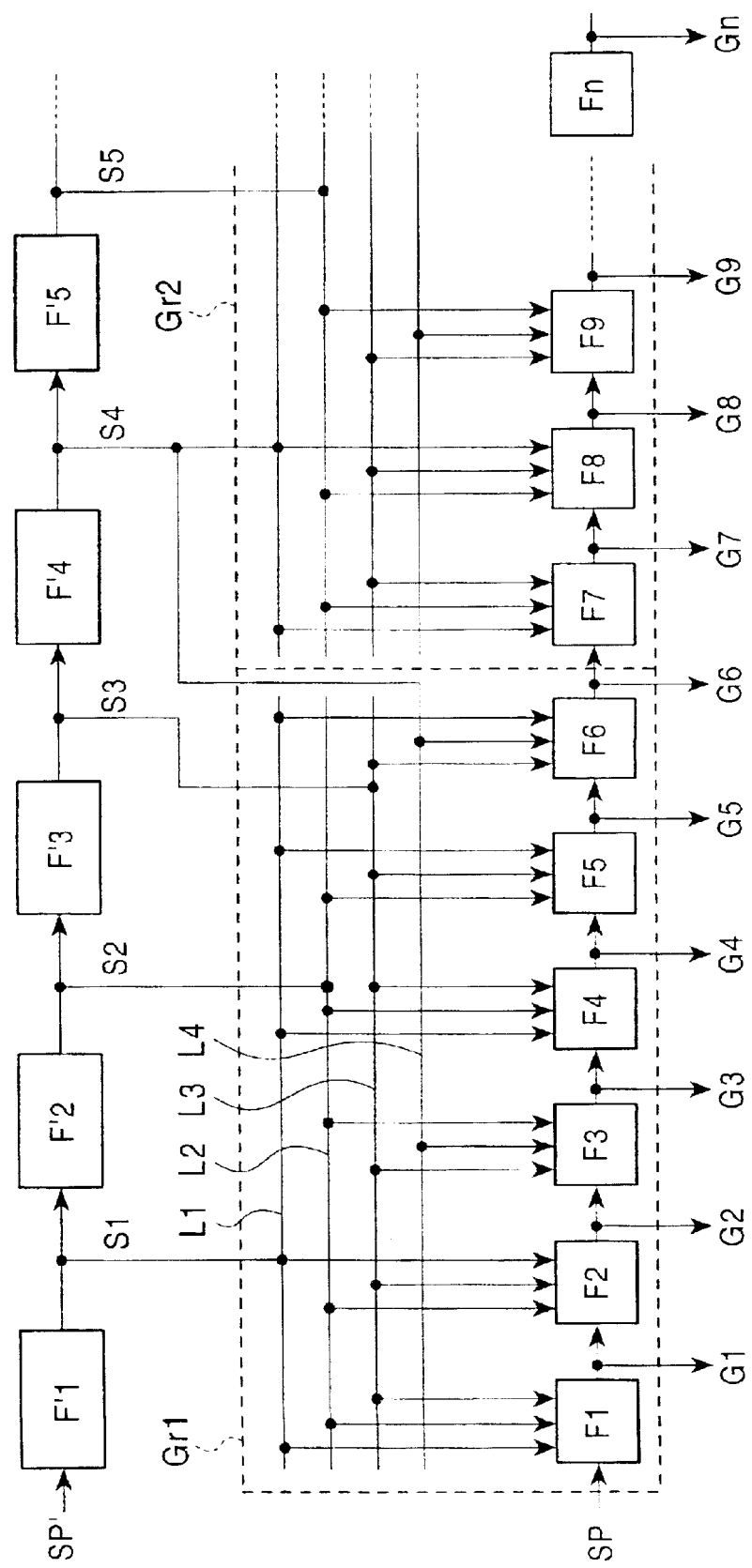
FIG. 6 is a structural view of a shift register circuit according to a third embodiment of the present invention.

FIG. 6 is a structural view of a shift register circuit according to a third embodiment of the present invention.

The structure of the third embodiment will be described below by referring to FIG. 6. The same symbols as those used in the first embodiment are assigned to the same components as those used in the first embodiment, and descriptions thereof are omitted. In the shift register circuit according to the present embodiment, four clock signal lines are provided for each group of a second shift register formed of stages F1, F2, F3, . . . For example, four clock signal lines L1, L2, L3, and L4 are provided for a group Gr1 formed of stages F1 to F6 in the second shift register. Clock signals S1, S2, S3, and S4 output from stages F'1, F'2, F'3, and F'4 in the first shift register are sent through the clock signal lines L1, L2, L3, and L4. The clock signal S4 is also sent to the next group Gr2.

Figure 7:
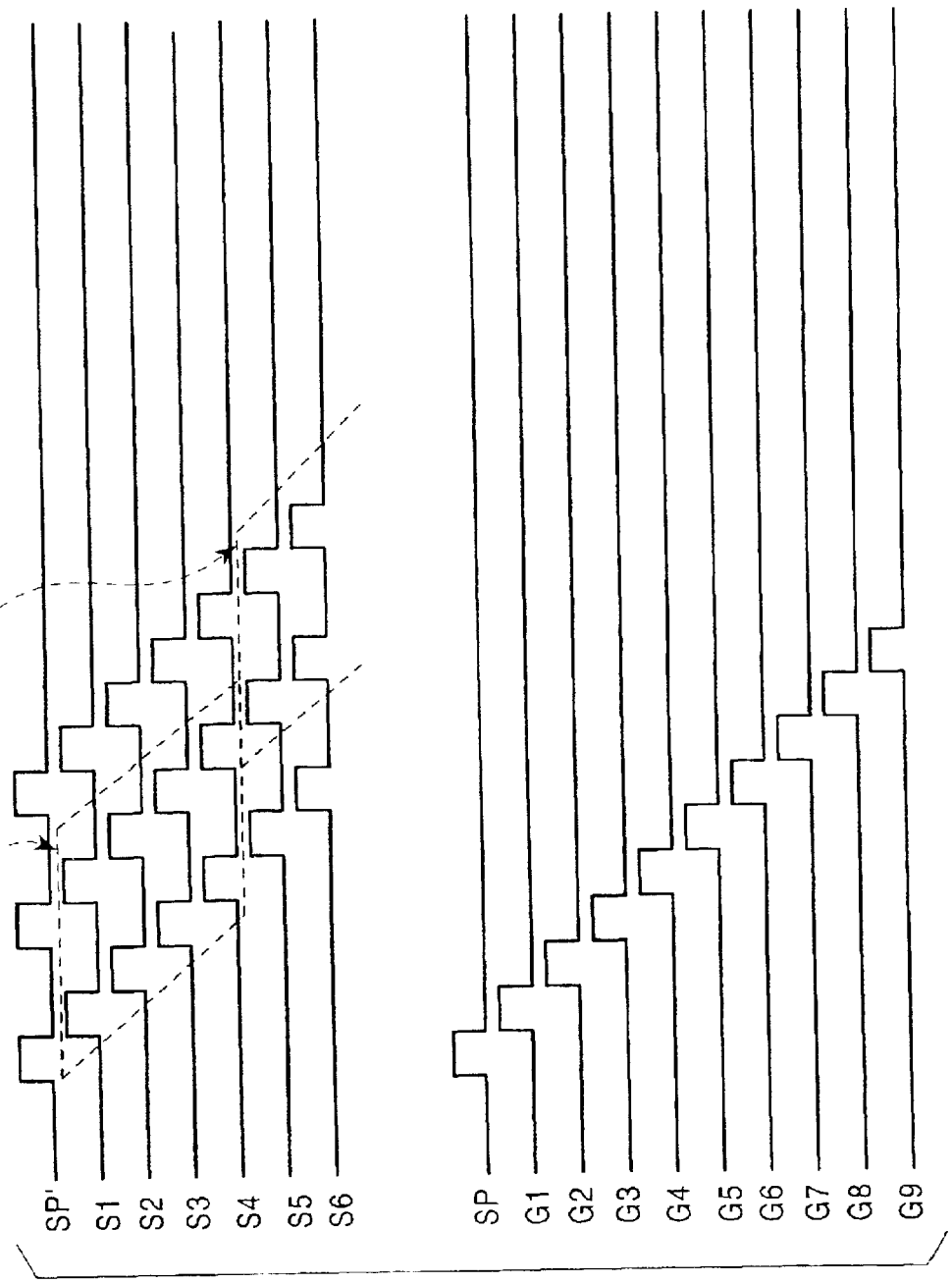
FIG. 7 is a timing chart of operations in the shift register circuit according to the third embodiment of the present invention.

FIG. 7 is a timing chart of operations in the above shift register circuit. A start pulse signal SP' having three consecutive pulses only is input to a first stage F'1 in the first shift register. These pulses are sequentially sent to the following stages. The stages F'1, F'2, F'3, . . . of the first shift register output clock signals S1, S2, S3, . . . each having three consecutive pulses at different phases. The clock signals S1, S2, S3, . . . are sent to groups in the second shift register. For example, the clock signals S1, S2, S3, and S4 are sent to the group Gr1 in the second shift register. The clock signal S4 is also sent to the next group Gr2.

The clock signals S1, S2, S3, and S4, sent to the group Gr1, drive stages F1 to F6 in the group Gr1. The clock signal S1 and the clock signal S4 have the same phase, but different timing shifted by one period. Therefore, the start pulse signal SP' for the first shift register, used in the present embodiment uses just three pulses, unlike the first embodiment which uses four pulses. A start pulse signal SP having one pulse only is input to the first stage F1 in the second shift register. The stages F1 to F6 constituting the group Gr1 in the second shift register sequentially output signals G1 to G6. Subsequent stages perform the same operation.

Also in the present embodiment, after the signal having the three consecutive pulses passes through each stage of the first shift register, all the clock signals output from the stages are fixed to the low level. Even for the second shift register, to which the clock signals are input, all the signals output from the stages are fixed to the low level after the pulse passes through them. In other words, since not-required stages through which the pulse has been passed are set to a halt state, power consumption of the shift register circuit is decreased.

For example, among the pulses included in the clock signals S1, S2, S3, and S4, pulses required for the operations of the group Gr1 in the second shift register are only those enclosed by a dotted line in the timing chart. Pulses other than those enclosed by the dotted line are unnecessary. Compared with the first embodiment (FIG. 2), unnecessary pulses are reduced. As described before, unnecessary pulses do not adversely affect the operations of the second shift register. But in terms of reducing power consumption, it is better to have fewer unnecessary pulses. When the second shift register is formed on a TFT substrate (glass substrate) and includes a thin film transistor (TFT), it is better to have fewer unnecessary pulses to reduce the voltage stress on the TFT. Therefore, the present embodiment provides even higher reliability than that of the first embodiment as power consumption is lower, and even when the second shift register includes a TFT, the voltage stress imposed on the TFT is low.

Figure 8:
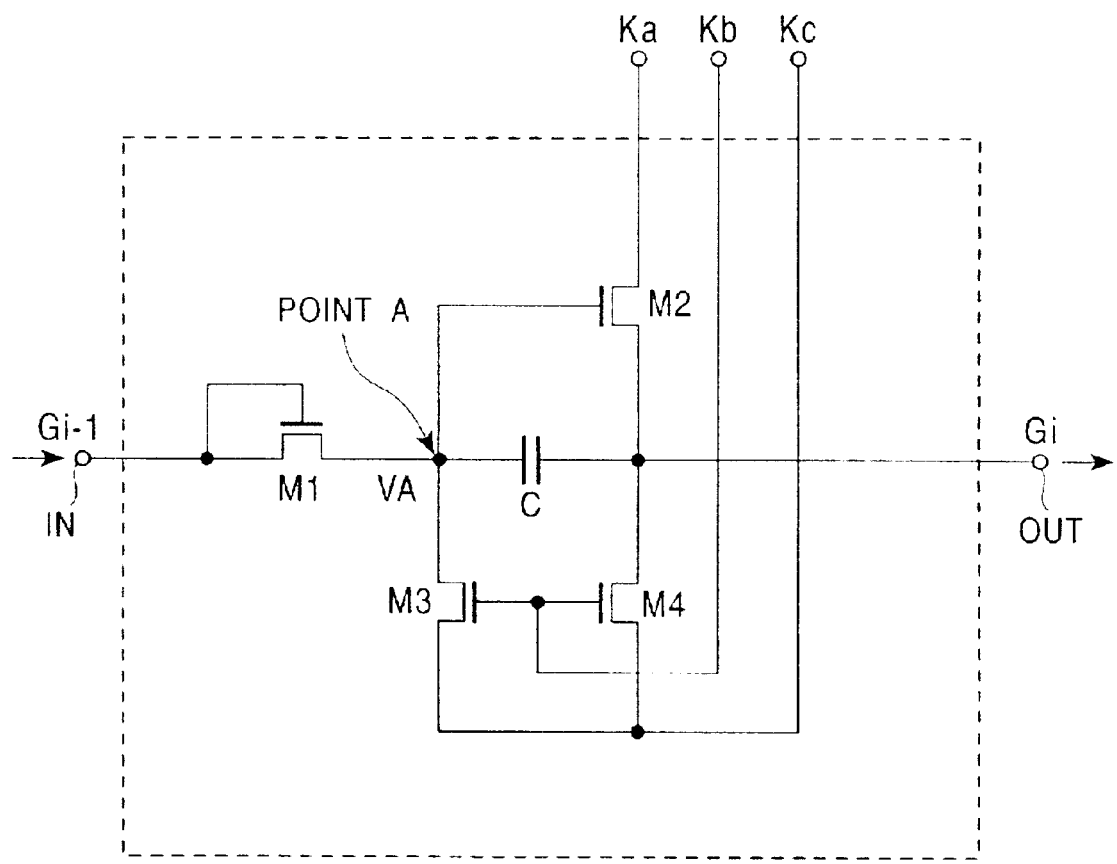
FIG. 8 is a circuit diagram of the internal circuit of a stage constituting a second shift register or a third shift register according to each embodiment of the present invention.

FIG. 8 is a circuit diagram of the internal circuit of a stage constituting the second shift register or the third shift register in each of the above embodiments of the present invention. The stage includes an input terminal IN that receives a signal Gi−1 output from a previous stage; an output terminal OUT that outputs a signal Gi to a subsequent stage; and three clock input terminals Ka, Kb, and Kc that receive three-phase clock signals.

The input terminal IN is connected to one end (point A) of a capacitor that serves as a storage device through an MIS transistor M1 that serves as a diode. The other end of the capacitor C is connected to the output terminal OUT. The clock input terminal Ka is connected to the drain of an MIS transistor M2; the clock input terminal Kb is connected to the gates of MIS transistors M3 and M4; and the clock input terminal Kc is connected to the sources of the MIS transistors M3 and M4. The one end (point A) of the capacitor C is connected to the gate of the MIS transistor M2 and to the drain of the MIS transistor M3. The other end of the capacitor C, that is, the output terminal OUT, is connected to the source of the MIS transistor M2 and to the drain of the MIS transistor M4.

This stage stores the input signal Gi−1 input from the input terminal IN in the capacitor C, and outputs it as the output signal Gi from the output terminal OUT. Even when the stage is not connected to a ground line, which is always maintained at the low level (L), if the clock input terminals Kb and Kc are set to the low level, the signal Gi output from the output terminal OUT is set (initialized) to the low level.

When a voltage is applied perpetually and in an identical direction between the gate and the source of an MIS transistor fabricated from conventional materials, such as amorphous silicon or polycrystalline silicon, the reliability of the MIS transistor is typically reduced.

In the stage circuits of a conventional shift register, when a clock signal having a high-level potential or a ground-level potential is input to the gates of the MIS transistors M3 and M4, and their sources are always connected to a connection line which is maintained at the ground potential, the potential of the gates is always equal to or higher than the potential of the sources, and a voltage is always applied between the gate and the source of each of the MIS transistors M3 and M4 in a constant direction.

In contrast, according to the structure of the stage shown in FIG. 8, a clock signal having a high-level potential or a ground-level potential is input to the gates of the MIS transistors M3 and M4, and a clock signal having a high-level potential or a ground-level potential is also input to their sources. Since these clock signals have different phases, the direction in which a voltage is applied between their gates and sources changes and is not fixed to one direction. Therefore, the reliability of the MIS transistor is increased.

Figure 9:
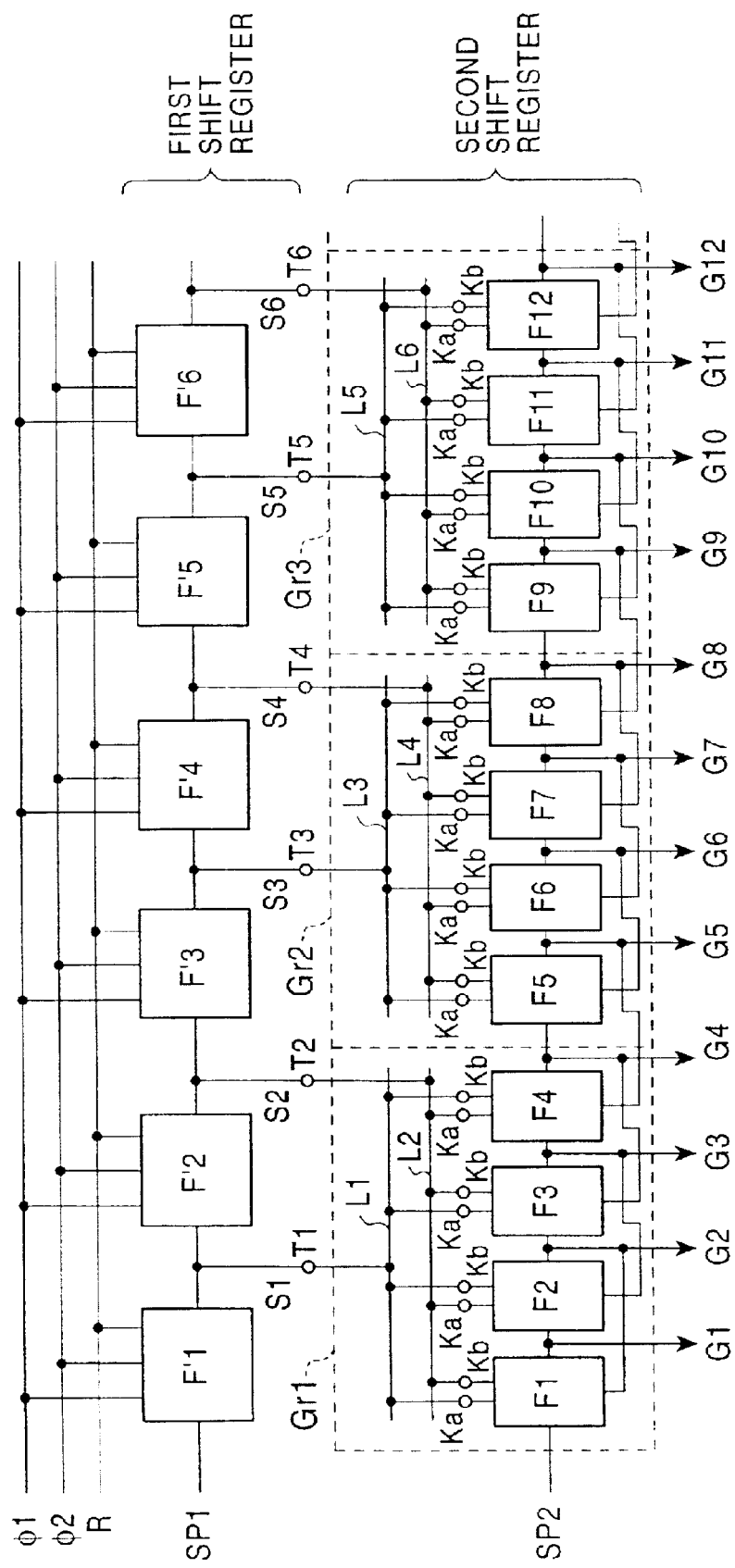
FIG. 9 is a block diagram showing the structure of a shift register circuit according to a fourth embodiment of the present invention.

FIG. 9 is a block diagram of a shift register circuit according to a fourth embodiment of the present invention. The shift register circuit includes a first shift register in which a plurality of stages F'1, F'2, F'3, . . . are connected in cascade, and a second shift register in which a plurality of stages F1, F2, F3, . . . are connected in cascade and four consecutive stages form one group. In the second shift register, stages F1 to F4, for example, form a group Gr1, stages F5 to F8 form a group Gr2, and stages F9 to F12 form a group Gr3. Excluding the initial and final stage in the second shift register, the stages are supplied with not only clock signals, but also an output from an immediately previous stage and an output from an immediately subsequent stage, no matter in which group the stages are disposed.

Two consecutive stages in the first shift register send two-phase clock signals from their output terminals to two clock input terminals provided for a group in the second shift register. For example, two consecutive stages F'1 and F'2 in the first shift register send two-phase clock signals S1 and S2 from their output terminals to two clock input terminals T1 and T2 provided for the group Gr1 in the second shift register. Stages F'3 and F'4 in the first shift register send clock signals S3 and S4 to two clock input terminals T3 and T4 of the group Gr2 in the second shift register.

Each of two clock input terminals provided for each stage in one group is connected to either one or the other of the two clock input terminals provided for the group. For example, each of two clock input terminals provided for each stage in the group Gr1 is connected to either one or the other of the clock signal lines L1 and L2, and these clock signal lines L1 and L2 are connected to the two clock input terminals T1 and T2 provided for the group Gr1. The clock signal lines L1 and L2 in the group Gr1 are not connected to any clock signal lines (such as clock signal lines L3 and L4 in the group Gr2) in the other groups. Therefore, clock signal lines in one group are not drawn through the whole area of the second shift register.

Since clock signal lines (such as the clock signal lines L1 and L2 in the group Gr1) in a group are wiring formed on a TFT substrate (glass substrate), their resistance is high. In contrast, wiring drawn from the output terminals (such as those of stages F'1 and F'2) of two consecutive stages in the first shift register to the two clock input terminals (such as the two clock input terminals T1 and T2 provided for the group Gr1) of the corresponding group in the second shift register is TCP wiring, and therefore, low-resistance wiring material can be used. Consequently, since clock signal lines for one group are not drawn through the whole area of the second shift register, delay of clock signals caused by a wiring resistance is decreased.

Figure 10:
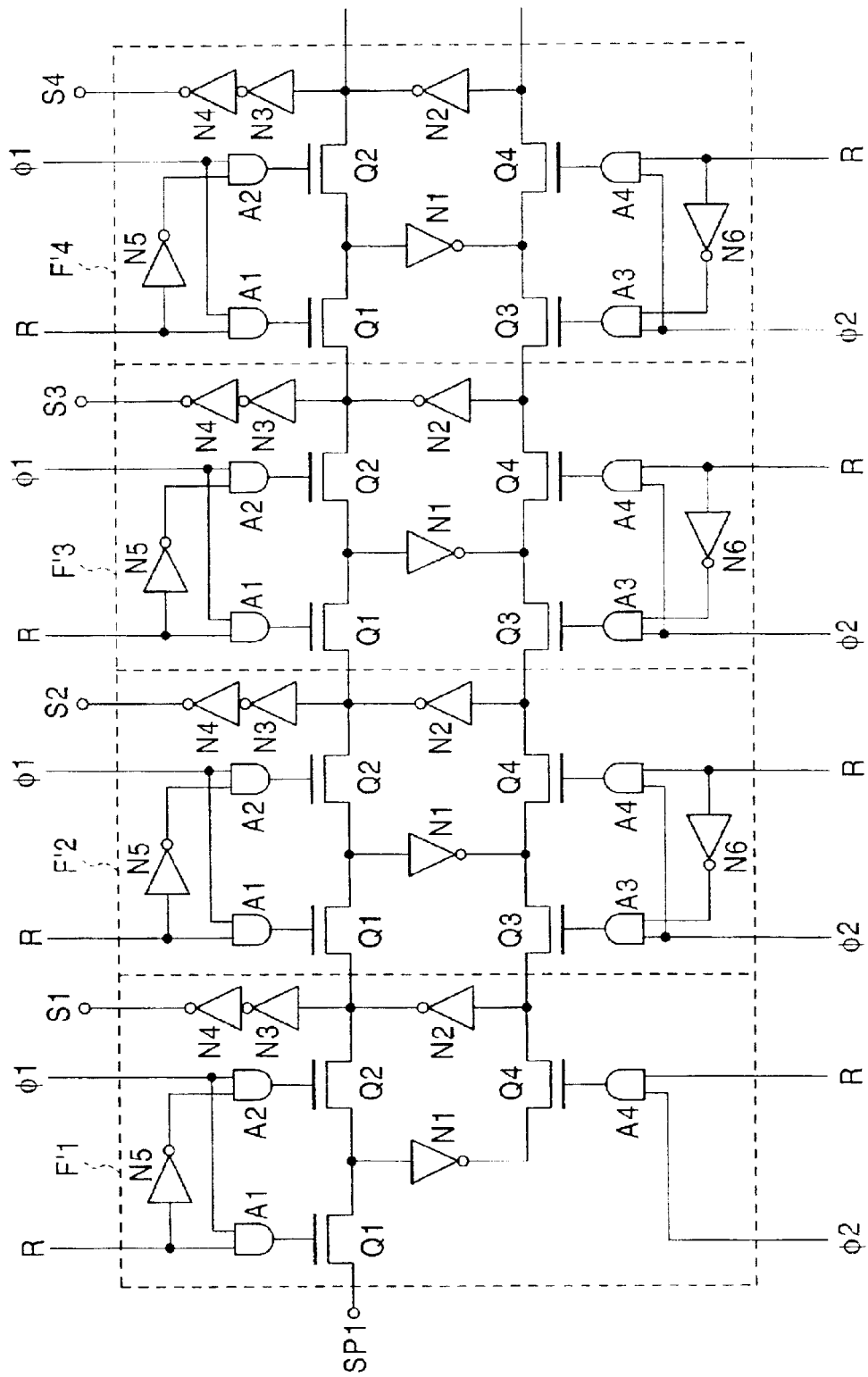
FIG. 10 is a circuit diagram showing the internal structure of stages F'1, F'2, F'3, and F'4 in a first shift register according to the fourth embodiment of the present invention.

FIG. 10 is a circuit diagram showing the internal structure of the stages F'1, F'2, F'3, F'4, . . . of the first shift register of the fourth embodiment. The first shift register is a bi-directional shift register, and transfers a clock signal stored in a stage of the first shift register to the left or the right in the figure by using two-phase clocks φ1 and φ2. The direction of transfer is determined by a control signal R.

Specifically, when the control signal R has a high level, the first shift register transfers a clock signal stored in a stage of the first shift register from the left to the right in the figure. When the control signal R has a low level, the first shift register transfers a clock signal stored in a stage of the first shift register from the right to the left in the figure.

The internal structure of the stages F'1, F'2, F'3, F'4, . . . of the first shift register will be described below by taking the stage F'2 as an example. Since the internal structure of the stages F'3, F'4, . . . is the same as that of the stage F'2, a description thereof is omitted. The internal structure of the stage F'1 is the same as that of the stage F'2 except for a point described later.

The stage F'2 includes four transistors Q1, Q2, Q3, and Q4; six inverters N1, N2, N3, N4, N5, and N6; and four logical AND gates A1, A2, A3, and A4. In the F'2 stage, the transistors Q1 and Q2 are connected in series, and the transistors Q3 and Q4 are connected in series. The input terminal of the inverter N1 is connected to the point where the transistors Q1 and Q2 are connected, and the output terminal of the inverter N1 is connected to the point where the transistors Q3 and Q4 are connected. The input terminal of the inverter N2 is connected to one end of the transistor Q4, which is not connected to the transistor Q3, and the output terminal of the inverter N2 is connected to one end of the transistor Q2, which is not connected to the transistor Q1.

The one end of the transistor Q2, which is not connected to the transistor Q1, is connected to the input terminal of the inverter N3. The inverters N3 and N4 are connected in series. The inverter N4 outputs a clock signal S1 from its output terminal.

One end of the transistor Q1 in the stage F'2, which is not connected to the transistor Q2 in the stage F'2, is connected to the output terminal of an inverter N2 in the previous stage F'1. One end of the transistor Q3 in the stage F'2, which is not connected to the transistor Q4 in the stage F'2, is connected to the input terminal of the inverter N2 in the previous stage F'1.

The output terminal of the inverter N2 in the stage F'2 is connected to one end of a transistor Q1 in the next stage F'3, which is not connected to a transistor Q2 in the stage F'3. The input terminal of the inverter N2 in the stage F'2 is connected to one end of a transistor Q3 in the next stage F'3, which is not connected to a transistor Q4 in the stage F'3.

A signal obtained by the logical AND of the clock φ1 and the control signal R is input to the gate of the transistor Q1.

A signal obtained by the logical AND of the clock φ1 and the inverted signal of the control signal R is input to the gate of the transistor Q2. A signal obtained by the logical AND of the clock φ2 and the inverted signal of the control signal R is input to the gate of the transistor Q3. A signal obtained by the logical AND of the clock φ2 and the control signal R is input to the gate of the transistor Q4.

The internal structure of the stage F'1 differs from that of the stage F'2 in that a start pulse signal SP1 is input to one end of a transistor Q1 in the stage F'1, which is not connected to the transistor Q2 in the stage F'1, and the stage F'1 does not have a transistor Q3, a logical AND gate A3, or an inverter N6.

Figure 11:
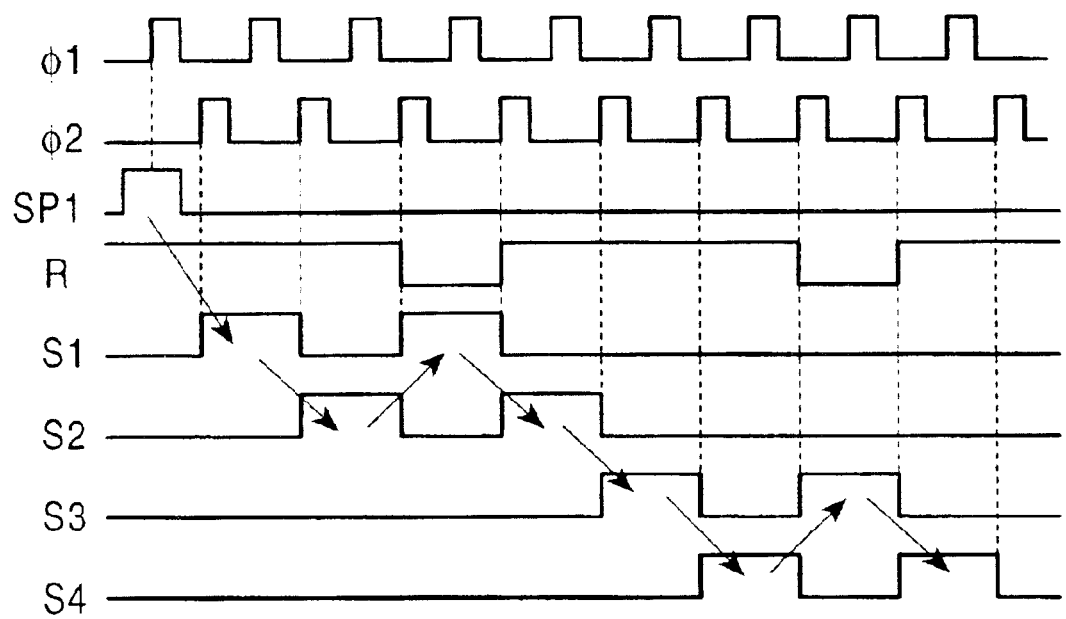
FIG. 11 is a timing chart of operations in the first shift register according to the fourth embodiment of the present invention.

FIG. 11 is a timing chart of operations in the first shift register. The clocks φ1 and φ2 have different phases shifted from each other by 180 degrees. When these two-phase clocks φ1 and φ2 are sent to the first shift register; the control signal R has the high level; and the start pulse signal SP1 having only one pulse is input to the first stage F'1 of the first shift register, a clock signal caused by the start pulse signal SP1 is transferred in the right direction. After the clock signal is transferred in the right direction by two stages, the control signal is set to the low level. The clock signal is then transferred in the left direction. After the clock signal is transferred in the left direction by one stage, the control signal R is again set to the high level. The clock signal is transferred in the right direction by three stages. By further repetition of one-stage left transfer and three-stage right transfer, the first shift register outputs clock signals S1, S2, S3, and S4 having waveforms shown in the figure.

Figure 12:
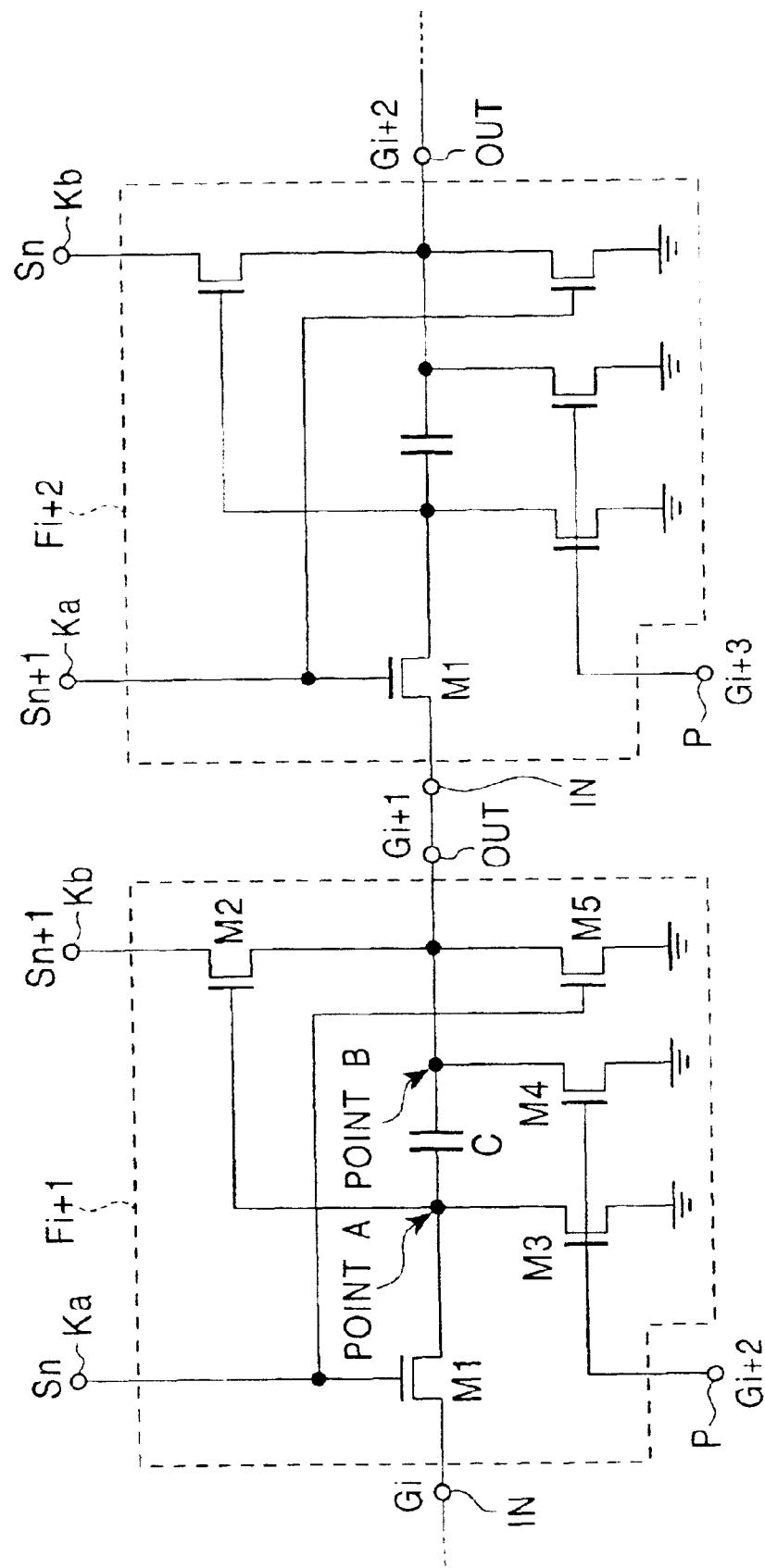
FIG. 12 is a circuit diagram showing the internal structure of stages Fi+1 and Fi+2 in a second shift register according to the fourth embodiment of the present invention.

FIG. 12 is a circuit diagram showing the internal structures of the stages Fi+1, Fi+2, . . . of the second shift register. The internal structures of the stages Fi+1, Fi+2, . . . of the second shift register will be described below by taking the stage Fi+1 as an example. Since the internal structures of the stage Fi+2, . . . are the same as that of the stage Fi+1, a description thereof is omitted.

The stage Fi+1 includes an input terminal IN for receiving a signal Gi output from a previous stage; an output terminal OUT for outputting a signal Gi+1 to the next stage Fi+2; two clock input terminals Ka and Kb for receiving two-phase clock signals Sn and Sn+1 output from the first shift register; and a terminal P for receiving a pulse signal Gi+2 output from the next stage Fi+2.

When the clock signal Sn is input to the clock input terminal Ka of the stage Fi+1, and the clock signal Sn+1 is input to the clock input terminal Kb of the stage Fi+1, the clock signal Sn+1 is input to the clock input terminal Ka of the next stage Fi+2, and the clock signal Sn is input to the clock input terminal Kb of the next stage Fi+2.

For example, when the clock signal S1 is input to the clock input terminal Ka of the stage F1, and the clock signal S2 is input to the clock input terminal Kb of the stage F1, the clock signal S2 is input to the clock input terminal Ka of the next stage F2, and the clock signal S1 is input to the clock input terminal Kb of the next stage F2.

The input terminal IN of the stage Fi+1 is connected to one end (point A) of a capacitor operating as a storage device, through an MIS transistor M1. The other end (point B) of the capacitor C is connected to the output terminal OUT. The clock input terminal Ka is connected to the gates of the MIS transistor M1 and an MIS transistor M5. The clock input terminal Kb is connected to the drain of an MIS transistor M2. The one end (point A) of the capacitor C is connected to the gate of the MIS transistor M2 and to the drain of an MIS transistor M3. The other end (point B) of the capacitor C is connected to the source of the MIS transistor M2, to the drain of an MIS transistor M4, and to the drain of the MIS transistor M5.

The stage Fi+1 stores the signal Gi input from the input terminal IN in the capacitor C serving as a storage device, and outputs it as the signal Gi+1 from the output terminal OUT. Therefore, the second shift register, formed of the stages Fi+1, Fi+2, . . . connected in cascade, sequentially transfers signals stored in the stages to the right by the two-phase clock signals Sn and Sn+1.

Figure 13:
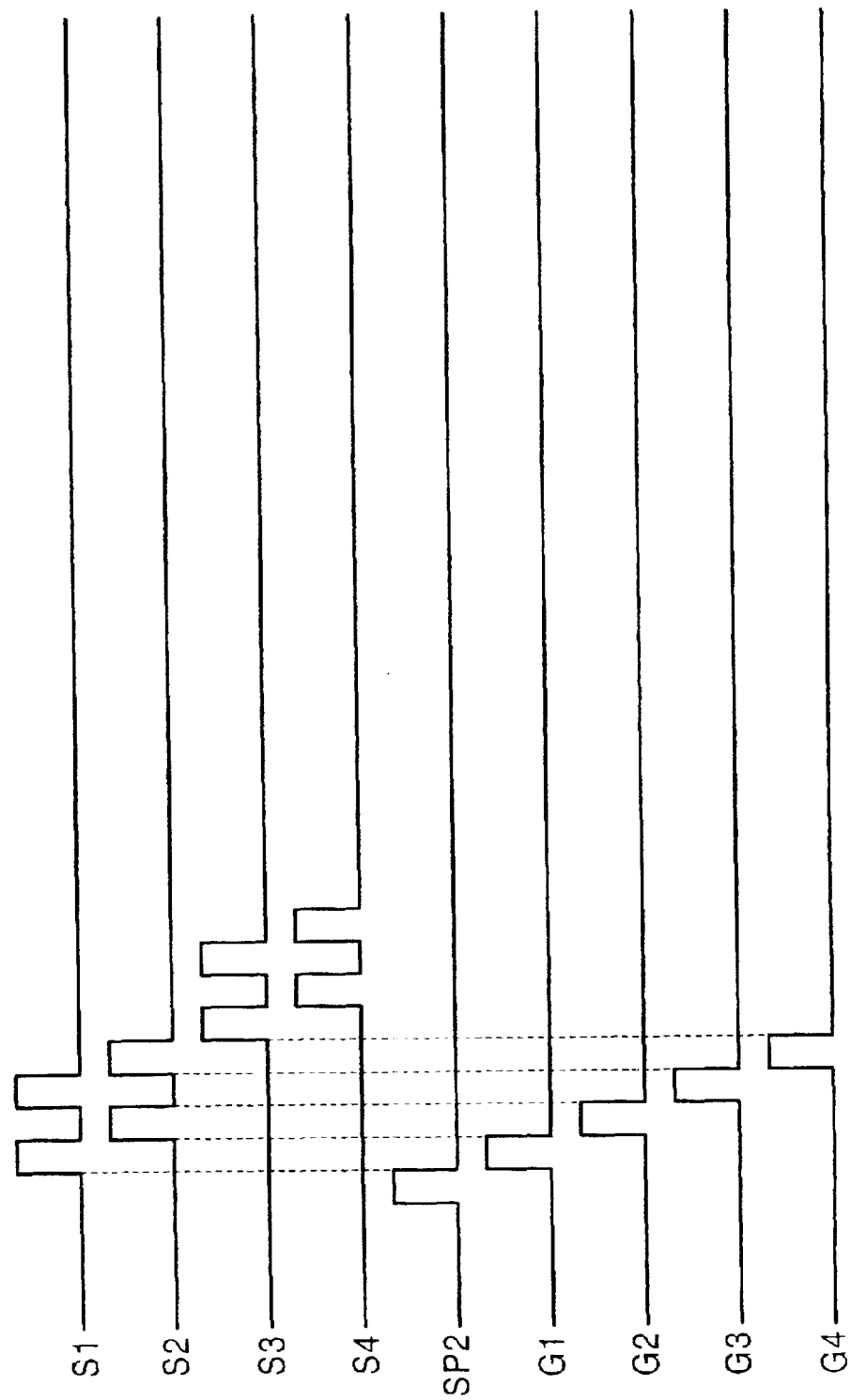
FIG. 13 is a timing chart of operations in the second shift register according to the fourth embodiment of the present invention.

FIG. 13 is a timing chart of operations in the second shift register. The second shift register uses the clock signals S1, S2, S3, S4, . . . output from the first shift register to sequentially transfer a signal caused by a start pulse signal SP2 input to the first stage F1 of the second shift register to the right to output signals G1, G2, G3, G4, . . . having waveforms shown in the figure.

After each group in the second shift register outputs a signal, the clock signals sent from the first shift register to the groups of the second shift register are all fixed to the low level. For example, after the group Gr1 in the second shift register outputs the signals G1 to G4, the clock signals input to the group Gr1 are all fixed to the low level. Then, since all the stages F1 to F4 of the group Gr1 enter a halting state, power consumption is decreased. Voltage stress does not continue to be imposed on the MIS transistors in the stages F1 to F4. Therefore, the MIS transistors are prevented from deteriorating.

The shift register circuit according to the present embodiment can drive a display apparatus having, for example, 480 scanning lines.

Figure 14:
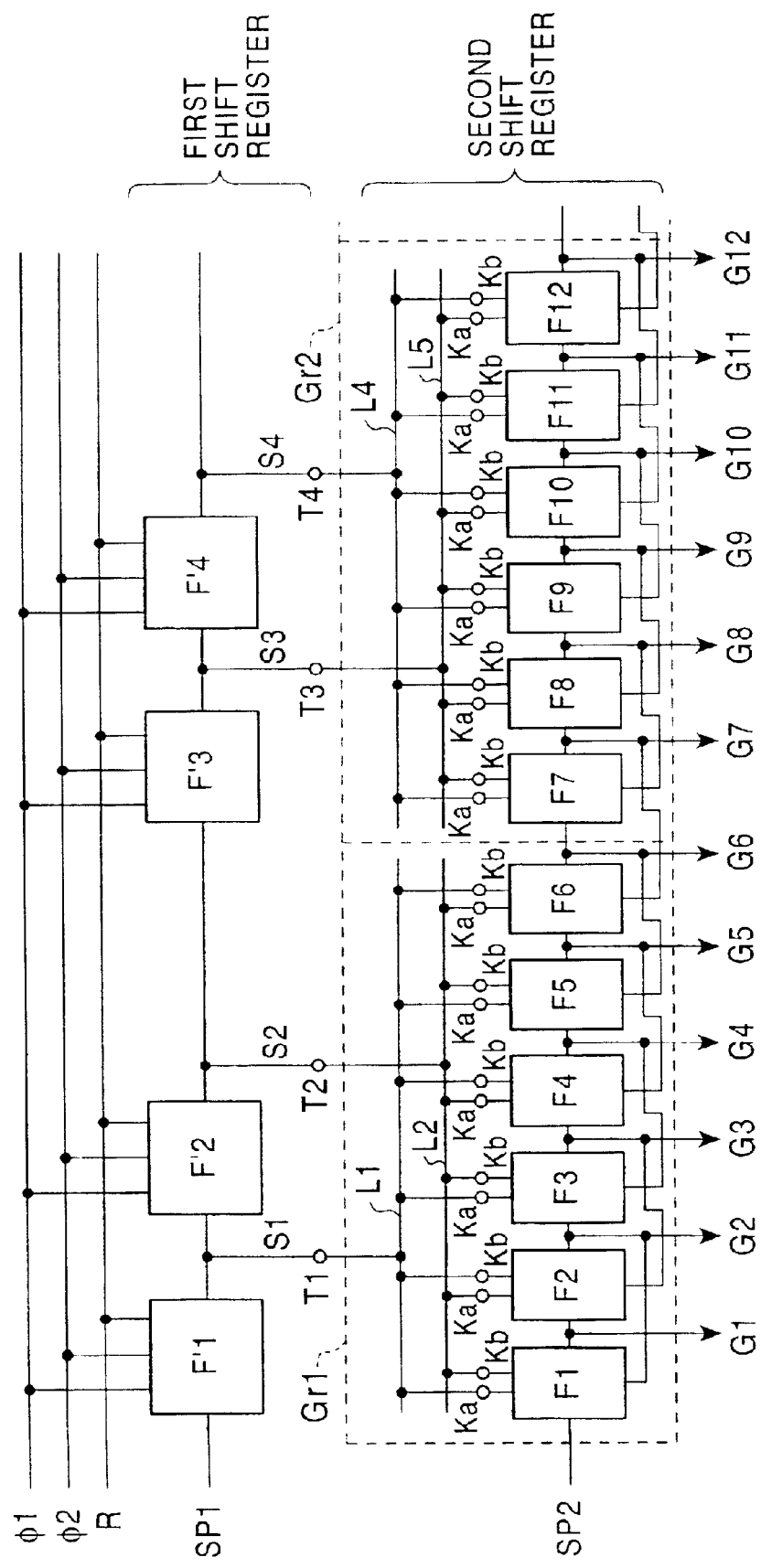
FIG. 14 is a block diagram showing the structure of a shift register circuit according to a fifth embodiment of the present invention.

FIG. 14 is a block diagram of a shift register circuit according to a fifth embodiment of the present invention. The shift register circuit includes a first shift register in which a plurality of stages F'1, F'2, F'3, F'4 . . . are connected in cascade, and a second shift register in which a plurality of stages F1, F2, F3, F4 . . . are connected in cascade and six consecutive stages form one group. In the second shift register, for example, stages F1 to F6 form a group Gr1, and stages F7 to F12 form a group Gr2.

Two consecutive stages in the first shift register send two-phase clock signals from their output terminals to two clock input terminals provided for a group in the second shift register. For example, two consecutive stages F'1 and F'2 in the first shift register send two-phase clock signals S1 and S2 from their output terminals to two clock input terminals T1 and T2 provided for the group Gr1 in the second shift register. Stages F'3 and F'4 in the first shift register send clock signals S3 and S4 to two clock input terminals T3 and T4 of the group Gr2 in the second shift register.

Since the connections other than those described above in the shift register circuit are the same as those described in the fourth embodiment, a description thereof is omitted. The internal structures of the stages F'1, F'2, F'3, F'4, . . . of the first shift register and the internal structures of the stages F1, F2, F3, F4, . . . of the second shift register are also the same as those described in the fourth embodiment, descriptions thereof are omitted.

Figure 15:
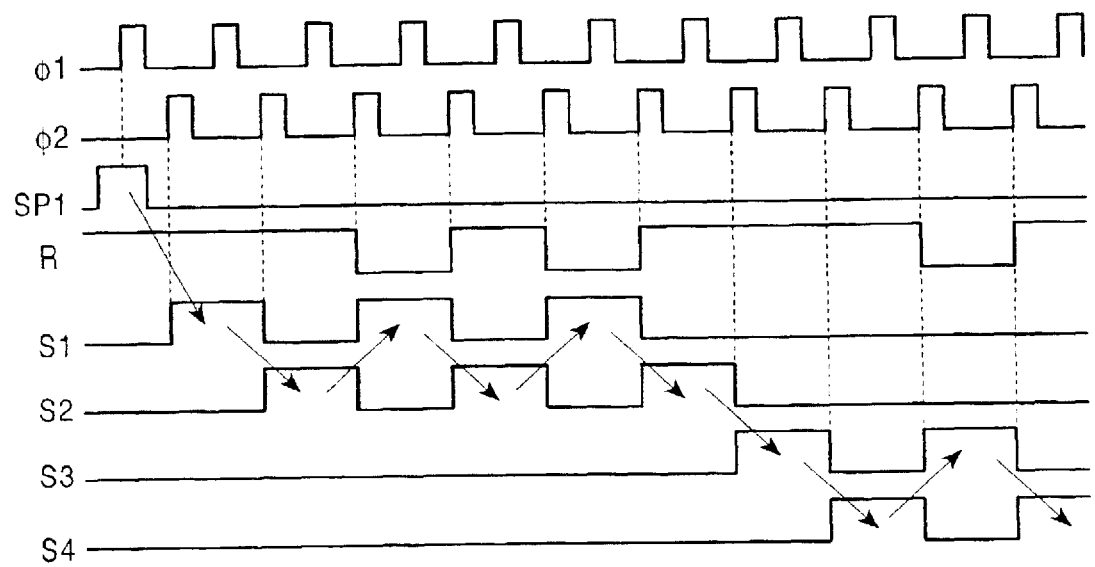
FIG. 15 is a timing chart of operations in a first shift register according to the fifth embodiment of the present invention.

FIG. 15 is a timing chart of operations in the first shift register. Clocks φ1 and φ2 have different phases shifted from each other by 180 degrees. When these two-phase clocks φ1 and φ2 are sent to the first shift register; a control signal R has a high level; and a start pulse signal SP1 having only one pulse is input to the first stage F'1 of the first shift register, a clock signal caused by the start pulse signal SP1 is transferred in the right direction. After the clock signal is transferred in the right direction by two stages, the control signal is set to the low level. The clock signal is then transferred in the left direction by one stage. Then, the control signal R is again set to the high level. The clock signal is transferred in the right direction by one stage. And then, the control signal R is again set to the low level. The clock signal is transferred in the left direction by one stage. Further, the control signal is again set to the high level. The clock signal is transferred in the right direction by two stages. By further repetition of one set of the above operations, that is, one-stage right transfer, one-stage left transfer, one-stage right transfer, one-stage left transfer, and two-stage right transfer, the first shift register outputs clock signals S1, S2, S3, and S4 having waveforms shown in the figure.

Figure 16:
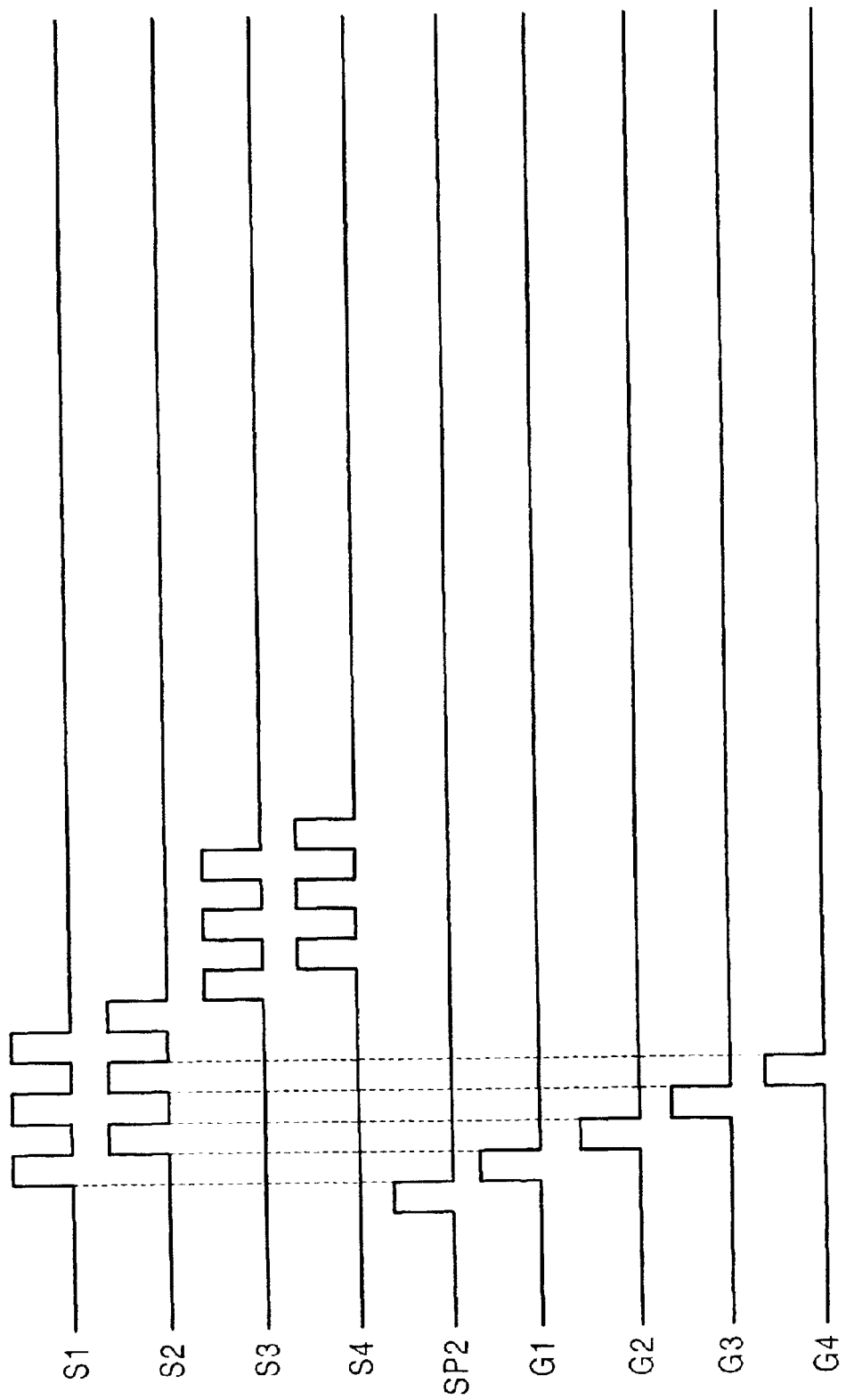
FIG. 16 is a timing chart of operations in a second shift register according to the fifth embodiment of the present invention.

FIG. 16 is a timing chart of operations in the second shift register. The second shift register uses the clock signals S1, S2, S3, S4, . . . output from the first shift register to sequentially transfer a signal caused by a start pulse signal SP2 input to the first stage F1 of the second shift register to the right to output signals G1, G2, G3, G4, . . . having waveforms shown in the figure.

In the embodiment shown in FIG. 14, since the number of the stages in the first shift register is one third that of the stages in the second register, the circuit scale of the first register is decreased. In addition, the number of the stages in the first shift register can be made less than one third. For example, the number of stages in the first shift register may be decreased to one fourth that of the stages in the second register by changing the group structure of the stages in the second shift register and the waveform pattern of the control signal R.

Figure 17:
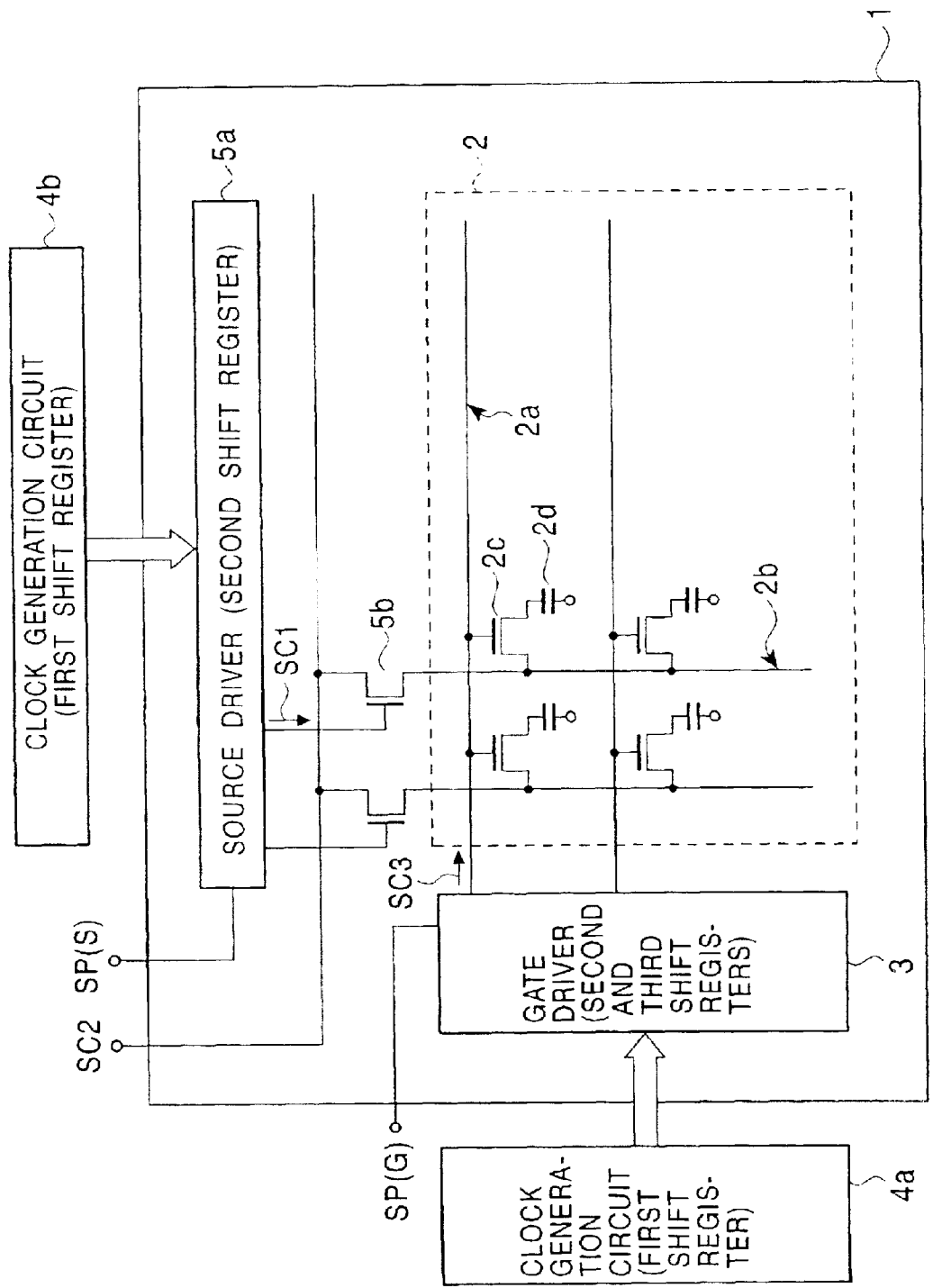
FIG. 17 is a structural view of a display apparatus in which a shift register circuit according to the present invention is used for a clock generation circuit and a gate driver, or used for a clock generation circuit and a source driver.

FIG. 17 is a structural view of a display apparatus in which a shift register circuit according to the present invention is used for a clock generation circuit and a gate driver, or used for a clock generation circuit and a source driver. In this display apparatus, a clock signal output from a clock generation circuit 4a is sent to a gate driver 3 disposed on a TFT substrate (the substrate of the display apparatus), and the gate driver 3 drives scanning lines 2a in a display area 2. A clock signal output from a clock generation circuit 4b is sent to a source driver 5a disposed on the TFT substrate (the substrate of the display apparatus), and a scanning signal SC1 output from the source driver 5a is applied to the gates of transistors 5b. The transistors 5b switch on and off a transmission of a source signal SC2 to signal lines 2b in the display area 2, according to the scanning signal SC1.

A first shift register according to an embodiment of the present invention can be used for the clock generation circuit 4a, and a second shift register and a third shift register can be used for the gate driver 3, which sends a scanning signal SC3 (corresponding to the signals G1, G2, . . . , or the signals GO1, GO2, . . . and GE1, GE2, . . . in the above-described embodiments) to the scanning lines 2a. Alternatively, a first shift register according to an embodiment of the present invention can be used for the clock generation circuit 4b, and a second shift register can be used for the source driver 5a, which applies the scanning signal SC1 (corresponding to the signals G1, G2, . . . in the above-described embodiments) to the gates of the transistors 5b.

Figure 18:
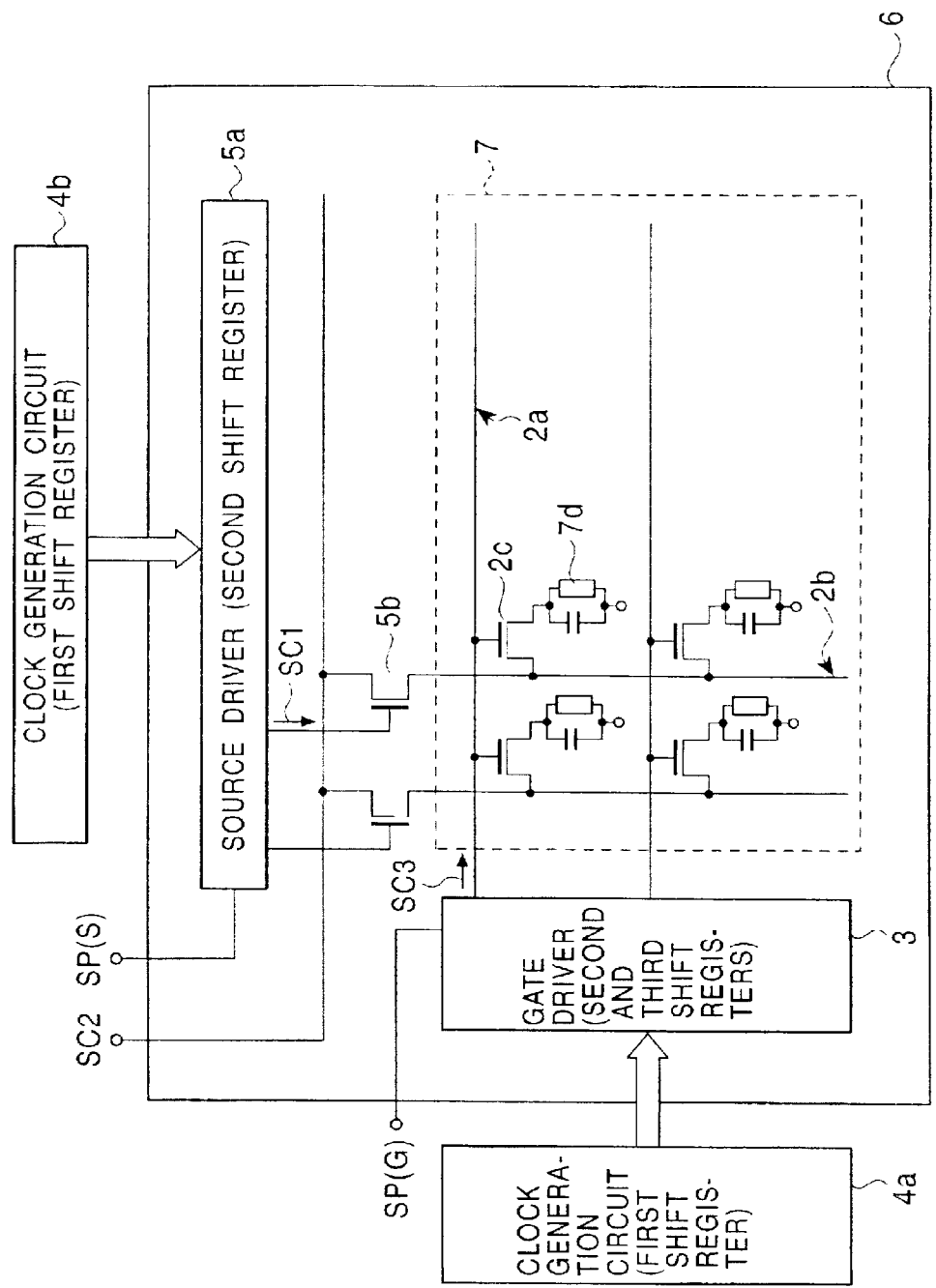
FIG. 18 is a structural view of an image sensor in which a shift register circuit according to the present invention is used for a clock generation circuit and a gate driver, or used for a clock generation circuit and a source driver.
Figure 19:
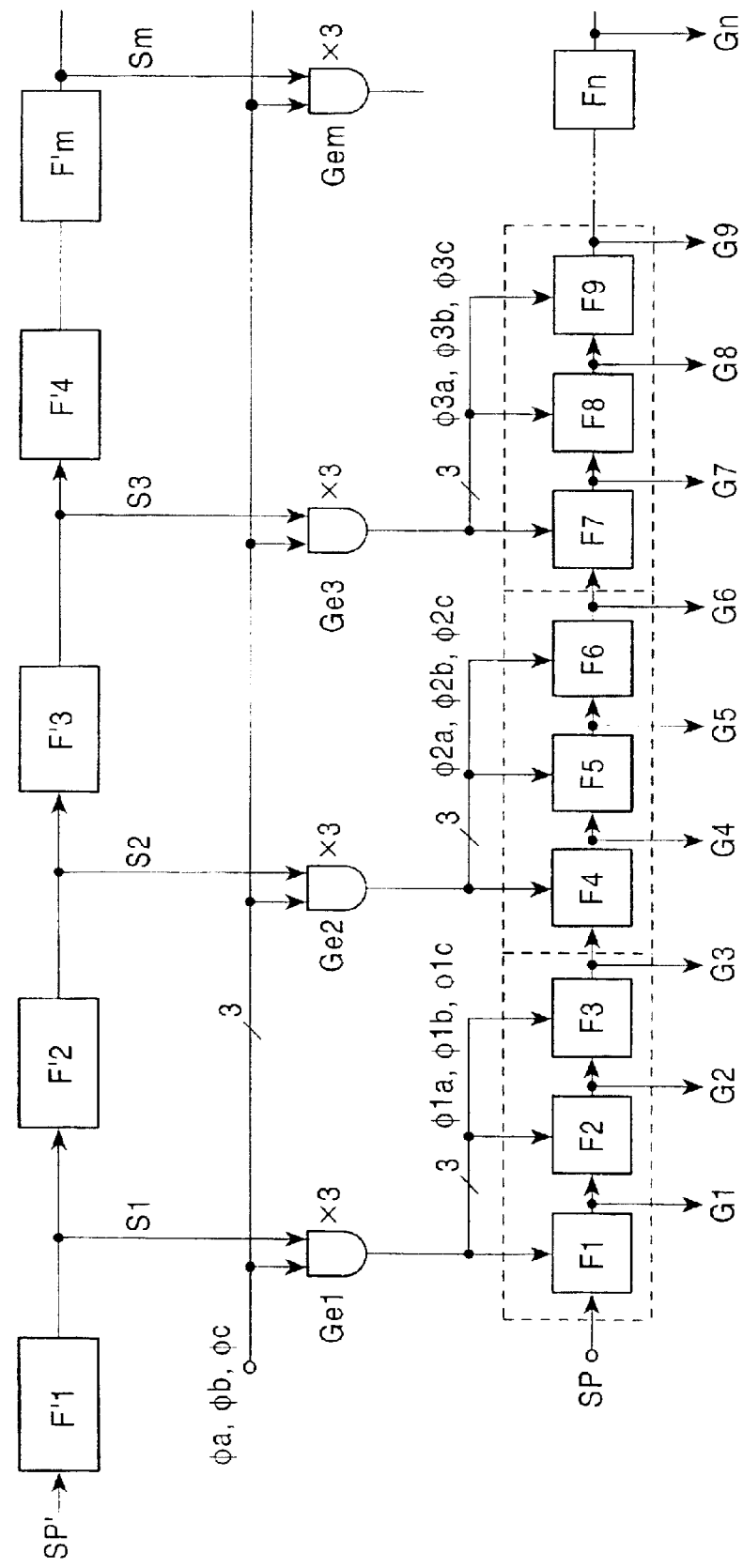
FIG. 19 is a circuit diagram of a conventional shift register circuit.

FIG. 18 is a structural view of an image sensor in which a shift register circuit according to the present invention is used for a clock generation circuit and a gate driver, or used for a clock generation circuit and a source driver. In this image sensor, light-receiving devices 7d are provided for a sensor area 7 disposed on a TFT substrate (the substrate of the image sensor), instead of display devices 2d provided for the display area 2 disposed on the TFT substrate (the substrate of the display apparatus) of the display apparatus shown in FIG. 17. The other structures are the same as those in the display apparatus shown in FIG. 17.

What is claimed is:

1. A shift register circuit comprising:
    a first shift register having a plurality of stages connected in cascade; and
    a second shift register having more stages than the first shift register;
    wherein the stages of the second shift register are divided into groups each formed of consecutive stages, and
    the stages of the first shift register are configured to transmit output pulse sequences having a predetermined number of consecutive pulses and having different phases from each other, to the stages constituting the groups of the second shift register as clock signals.

2. A shift register circuit according to claim 1, wherein the first shift register has an input terminal configured to receive a pulse sequence having a finite number of consecutive pulses.

3. A shift register circuit according to claim 1, wherein the first shift register is a bi-directional shift register.

4. A shift register circuit according to claim 2, wherein a plurality of the second shift registers is provided.

5. A shift register circuit according to claim 1, further comprising an active matrix circuit having switching devices associated with intersections of signal lines and scanning lines, the scanning lines configured to receive outputs of the stages of the second shift register as scanning signals.

6. A shift register circuit according to claim 5, the active matrix circuit and the second shift register comprising MIS transistors of the same type.

7. A shift register circuit according to claim 5, the active matrix circuit and the second shift register comprising MIS transistors fabricated from one of amorphous silicon and polycrystalline silicon.

8. A shift register circuit according to claim 5, further comprising a substrate on which the second shift register and the active matrix circuit are disposed.

9. A shift register circuit according to claim 2,
    wherein each stage of the second shift register has as terminals only:
        clock input terminals configured to receive n-phase (n is an integer of at least two) clock signals;
        an input terminal configured to receive a signal sent one of from an input terminal of the second shift register and from an output terminal of a previous stage; and
        an output terminal configured to output a signal to one of to an input terminal of a subsequent stage and to an output terminal of the second shift register, and
        an initial-stage level configured to initialize a state of each stage of the second shift register input to a selected stage at one of the clock input terminals.

10. A display apparatus comprising a shift register circuit according to claim 1.

11. A display apparatus according to claim 10, further comprising an active matrix circuit having switching devices associated with intersections of signal lines and scanning lines, the scanning lines configured to receive outputs of the stages of the second shift register as scanning signals.

12. A display apparatus according to claim 11, the active matrix circuit and the second shift register comprising MIS transistors of the same type.

13. A display apparatus according to claim 11, the active matrix circuit and the second shift register comprising MIS transistors fabricated from one of amorphous silicon and polycrystalline silicon.

14. A display apparatus according to claim 11, further comprising a substrate on which the second shift register and the active matrix circuit are disposed.

15. An image sensor comprising a shift register circuit according to claim 1.

16. An image sensor according to claim 15, further comprising an active matrix circuit having switching devices associated with intersections of signal lines and scanning lines, the scanning lines configured to receive outputs of the stages of the second shift register as scanning signals.

17. An image sensor according to claim 16, the active matrix circuit and the second shift register comprising MIS transistors of the same type.

18. An image sensor according to claim 16, the active matrix circuit and the second shift register comprising MIS transistors fabricated from one of amorphous silicon and polycrystalline silicon.

19. An image sensor according to claim 16, further comprising a substrate on which the second shift register and the active matrix circuit are disposed.

20. A shift register circuit according to claim 1, each group of the second shift register configured to receive output pulses from a set of the stages of the first shift register, the output pulses from the set of stages supplied to each group being isolated from every other group.

21. A shift register circuit according to claim 1, the stages in each group of the second shift register being divided into an even group configured to receive an even field of output pulses supplied to stages in the even group and an odd group configured to receive an odd field of output pulses supplied to stages in the odd group, the even and odd fields of each group having different timings of the output pulses.

22. A shift register circuit according to claim 21, the even and odd groups each configured to receive a single start pulse with different timings.

23. A shift register circuit according to claim 1, each group having at least at many stages as clock signals, each stage in each group having input terminals configured to receive the same number of clock signals, at least one stage in a particular group having the clock signals supplied in a different order from at least one other stages in the particular group.

24. A shift register circuit according to claim 1, excluding an initial and final stage, the stages having input terminals configured to receive an output from an immediately previous stage and an output from an immediately subsequent stage.

25. A shift register circuit comprising:
at least one second shift register having a plurality of stages connected in cascade, the at least one second shift register divided into groups of consecutive stages; and
clock lines connected with the stages in each group, the clock lines configured to supply clock signals to the stages, the clock lines of each group isolated from the clock lines in each other group, the clock signals having a predetermined number of consecutive pulses with different phases from each other.

26. A shift register circuit according to claim 25, each stage comprising terminals, the terminals including:
clock input terminals configured to receive the clock signals;
a first input terminal configured to receive an output signal from one of an output terminal of a previous stage and an external start pulse; and
an output terminal configured to receive an output signal.

27. A shift register circuit according to claim 26, the terminals further comprising a second input terminal configured to receive an output signal from an output terminal of a subsequent stage.

28. A shift register circuit according to claim 27, wherein the second input terminal is configured to receive an output signal from an immediately previous stage and an output signal from an immediately subsequent stage.

29. A shift register circuit according to claim 25, further comprising a first shift register having fewer stages than the second shift register, the stages of the first shift register configured to supply the clock signals to the clock lines.

30. A shift register circuit according to claim 25, the stages in each group of the second shift register being divided into an even group configured to receive an even field of output pulses supplied to stages in the even group and an odd group configured to receive an odd field of output pulses supplied to stages in the odd group, the even and odd fields of each group having different timings of the output pulses, the even and odd groups each having a single start pulse with different timings.

31. A shift register circuit according to claim 25, each group having at least at many stages as clock signals, each stage in each group having input terminals configured to receive the same number of clock signals, at least one stage in a particular group configured to receive the clock signals supplied differently from at least one other stage in the particular group.

32. A method of increasing reliability of a shift register circuit having a first and second shift register, the method comprising:
dividing stages in the second shift register into groups of consecutive stages;
supplying clock lines of the second shift register with clock signals of different phases from the first shift register; and
isolating the clock lines between groups.

33. A method according to claim 32, further comprising reducing a wiring resistance and capacitance of the clock lines by reducing a length and a line width of the clock lines.

34. A method according to claim 32, further comprising reducing at least one of a number and duration of pulses applied to the first shift register and second shift register.

35. A method according to claim 32, further comprising forming the clock lines on a thin film transistor substrate and forming TCP wiring connecting the clock lines with the first shift register.

36. A method according to claim 32, further comprising receiving an output signal from a previous stage in a particular stage and supplying an output signal to a subsequent stage from the particular stage.

37. A method according to claim 36, further comprising feeding back an output signal from the subsequent stage in the particular stage.

38. A method according to claim 32, further comprising supplying pulses through stages in the first shift register, decreasing a number of the pulses used effectively and supplied to the clock lines.

39. A method according to claim 32, further comprising dividing the groups into even group having an even field of output pulses supplied to stages in the even group and an odd group having an odd field of output pulses supplied to stages in the odd group, initiating the even and odd groups with a single start pulse, and differing timings of the output pulses between the even and odd fields of each group.

40. A method according to claim 32, further comprising supplying the same clock signals to all stages in a particular group and supplying the clock signals to at least one of the stages in the particular group differently from at least one other stage in the particular group.

41. A method according to claim 32, further comprising fixing the clock signals from all stages of the first shift register to a low level after clock pulses pass through each stage of the first shift register.

* * * * *